United States Patent
Kawashima et al.

(10) Patent No.: US 9,425,264 B2
(45) Date of Patent: Aug. 23, 2016

(54) METHOD FOR GROWING AN EPITAXIAL FILM ON A PHOSPHOROUS-DOPED SILICON WAFER

(71) Applicants: SUMCO CORPORATION, Tokyo (JP); SUMCO TECHXIV CORPORATION, Nagasaki (JP)

(72) Inventors: Tadashi Kawashima, Nagasaki (JP); Naoya Nonaka, Nagasaki (JP); Masayuki Shinagawa, Nagasaki (JP); Gou Uesono, Nagasaki (JP)

(73) Assignees: SUMCO CORPORATION, Tokyo (JP); SUMCO TECHXIV CORPORATION, Nagasaki (JP)

(*) Notice: Subject to any disclaimer, the term of this patent is extended or adjusted under 35 U.S.C. 154(b) by 233 days.

(21) Appl. No.: 13/925,267

(22) Filed: Jun. 24, 2013

(65) Prior Publication Data
US 2014/0001605 A1    Jan. 2, 2014

(30) Foreign Application Priority Data
Jun. 29, 2012 (JP) ................... 2012-146636

(51) Int. Cl.
*C30B 25/10* (2006.01)
*H01L 29/167* (2006.01)
(Continued)

(52) U.S. Cl.
CPC .......... *H01L 29/167* (2013.01); *H01L 21/0262* (2013.01); *H01L 21/02381* (2013.01);
(Continued)

(58) Field of Classification Search
CPC ........ C30B 15/00; C30B 15/02; C30B 15/04; C30B 15/20; C30B 15/206; C30B 25/00; C30B 25/02; C30B 25/04; C30B 25/10; C30B 25/16; C30B 25/18; C30B 25/20; C30B 33/00; C30B 33/005; C30B 33/02; C30B 33/08; C30B 33/12; H01L 21/02002; H01L 21/02005; H01L 21/02008; H01L 21/02038; H01L 21/02104; H01L 21/02107; H01L 21/02164; H01L 21/02518; H01L 21/02532
USPC ......... 117/11, 13, 19, 21, 84, 88, 94–97, 106, 117/928, 931–932
See application file for complete search history.

(56) References Cited

U.S. PATENT DOCUMENTS

| | | |
|---|---|---|
| 5,421,288 A | 6/1995 | Ohta et al. |
| 5,487,358 A | 1/1996 | Ohta et al. |

(Continued)

FOREIGN PATENT DOCUMENTS

| | | | |
|---|---|---|---|
| JP | 2000-286268 A | | 10/2000 |
| JP | 2000286268 A | * | 10/2000 |

(Continued)

OTHER PUBLICATIONS

Korea Office action, dated Aug. 12, 2014 along with an english translation thereof, for 10-2013-0072869.

(Continued)

*Primary Examiner* — Kenneth A Bratland, Jr.
(74) *Attorney, Agent, or Firm* — Greenblum & Bernstein, P.L.C.

(57) ABSTRACT

A method includes: a backside-oxidation-film-formation step in which an oxidation film is formed on a backside of a silicon wafer; a backside-oxidation-film-removal step in which the oxidation film provided at an outer periphery of the silicon wafer is removed; an argon-annealing step in which the silicon wafer after the backside-oxidation-film-removal step is subjected to a heat treatment in an argon gas atmosphere at a temperature in a range from 1200 to 1220 degrees C. for 60 minutes or more and 120 minutes or less; and an epitaxial-film-formation step in which an epitaxial film is formed on a surface of the silicon wafer after the argon-annealing step.

9 Claims, 22 Drawing Sheets

(51) Int. Cl.
*H01L 21/322* (2006.01)
*H01L 29/02* (2006.01)
*H01L 21/02* (2006.01)
*H01L 29/06* (2006.01)

(52) U.S. Cl.
CPC .... *H01L21/02532* (2013.01); *H01L 21/02576* (2013.01); *H01L 21/02658* (2013.01); *H01L 21/3221* (2013.01); *H01L 29/02* (2013.01); *H01L 29/0603* (2013.01)

(56) References Cited

U.S. PATENT DOCUMENTS

| | | | |
|---|---|---|---|
| 6,001,175 | A | 12/1999 | Maruyama et al. |
| 7,498,218 | B2 | 3/2009 | Ahn |
| 8,101,508 | B2 | 1/2012 | Kurita et al. |
| 2001/0039915 | A1* | 11/2001 | Abe ................ C30B 29/06 117/2 |
| 2002/0195045 | A1* | 12/2002 | Lu .................. C30B 15/14 117/13 |
| 2009/0205562 | A1 | 8/2009 | Wada |
| 2009/0224367 | A1 | 9/2009 | Kurita et al. |
| 2010/0213068 | A1 | 8/2010 | Haberecht |
| 2010/0213168 | A1 | 8/2010 | Haberecht |
| 2010/0327415 | A1* | 12/2010 | Arai ................ C30B 25/20 257/618 |
| 2013/0337638 | A1 | 12/2013 | Kawashima et al. |

FOREIGN PATENT DOCUMENTS

| | | | |
|---|---|---|---|
| JP | 2003-273063 | | 9/2003 |
| JP | 2006-186174 | A | 7/2006 |
| JP | 2009-200074 | A | 9/2009 |
| JP | 2010-153631 | | 7/2010 |
| JP | 2010153631 | A * | 7/2010 |
| JP | 2010-205866 | | 9/2010 |
| JP | 2011-009613 | | 1/2011 |
| JP | 2011-009614 | | 1/2011 |
| JP | 2011-029440 | A | 2/2011 |
| JP | 2011-114210 | | 6/2011 |
| KR | 10-0827038 | B | 5/2008 |
| KR | 10-2009-0095514 | A | 9/2009 |

OTHER PUBLICATIONS ( U.S. Appl. No. 13/916,768, published as US2013/0337638) Office action, dated May 29, 2014.

* cited by examiner

METHOD FOR GROWING AN EPITAXIAL FILM ON A PHOSPHOROUS-DOPED SILICON WAFER

The entire disclosure of Japanese Patent Application No. 2012-146636 filed Jun. 29, 2012 is expressly incorporated by reference herein.

BACKGROUND OF THE INVENTION

1. Field of the Invention

The present invention relates to a manufacturing method of an epitaxial silicon wafer, and an epitaxial silicon wafer.

2. Description of Related Art

Epitaxial silicon wafers for power MOS transistors, for instance, is required to have extremely low substrate resistivity. In order to sufficiently lower the substrate resistivity of silicon wafers, it is known to dope molten silicon with an n-type dopant for resistivity adjustment (e.g. arsenic (As) and antimony (Sb)) during pull-up step (i.e. in growing silicon crystal) of a single crystal ingot for providing silicon wafers (referred to as a single crystal ingot hereinafter). However, since such dopants are extremely volatile, it is difficult to sufficiently increase the dopant concentration in the silicon crystals. Thus, silicon wafers exhibiting desired sufficiently low resistivity is difficult to be manufactured.

Accordingly, silicon wafers with extremely low substrate resistivity have come to be used in which phosphorus (P) as an n-type dopant that is less volatile than arsenic (As) and antimony (Sb) is doped at a high concentration (see, for instance, Literature 1: JP-A-2010-153631).

The Literature 1 discloses that, when an epitaxial film is grown on a silicon wafer provided by a single crystal ingot that is densely doped with phosphorus and germanium (Ge) while being grown, a number of stacking faults (abbreviated as "SF" hereinafter) are generated on the epitaxial film, the SF appearing on the surface of the silicon wafer in a form of steps to significantly deteriorate LPD (Light Point Defect) level on the surface of the silicon wafer.

In order to overcome the above deficiencies, the Literature 1 discloses that the epitaxial film is grown at a low temperature of 1000 to 1090 degrees C. with a CVD method after applying a prebaking treatment on the silicon wafer in a hydrogen gas atmosphere.

On the other hand, since epitaxial growth occurs on an epitaxial silicon wafer at a high temperature, oxygen precipitates (BMD) or oxygen precipitation nuclei formed in the crystal while growing the single crystal ingot are dissipated by the high temperature heat treatment, thereby lowering gettering ability.

In order to overcome the shortage in gettering ability, it is known to apply a polysilicon back-seal (PBS) before the epitaxial growth. The polysilicon back seal method is a kind of EG (External Gettering) in which a polysilicon film is formed on a backside of a silicon wafer to make use of strain fields or lattice mismatch created at an interface between the polysilicon film and the silicon wafer.

Literature 2 (JP-A-2011-9613) discloses that, in order to enhance the gettering ability, a polysilicon film is formed on a backside of a silicon wafer under a specific PBS condition before growing an epitaxial film on a silicon wafer provided by a single crystal ingot in which phosphorus and germanium are doped while growing the single crystal ingot.

Specifically, Literature 2 discloses that, since a large number of SF are formed on an epitaxial film even when a polysilicon film is formed on a backside of a silicon wafer, the SF appearing on the surface of the silicon wafer in a form of steps to significantly deteriorate the LPD level of the surface of the silicon wafer, the polysilicon film is formed on the backside of the silicon wafer at a temperature of less than 600 degrees C., whereby the creation of SF can be effectively restrained.

There is a recent need for an n-type silicon wafer of which substrate resistivity is 0.9 mΩ·cm or less. In order to respond to such a need, an epitaxial silicon wafer produced by forming an epitaxial film on a silicon wafer in which red phosphorus is densely doped when growing a single crystal ingot is required.

It is conceivable to apply the processes disclosed in Literatures 1 and 2 in order to manufacture such an epitaxial silicon wafer.

However, experiments performed by the inventors of the present application reveal that, when the substrate resistivity is extremely low (e.g. 0.9 mΩ·cm or less as in the above), generation of SF cannot be restrained even by applying the methods disclosed in Literatures 1 and 2, so that a high-quality epitaxial silicon wafer cannot be manufactured. In addition, it has been also revealed that, in accordance with the reduction in the substrate resistivity, red phosphorus emits out of a silicon wafer during the growth of an epitaxial film to be incorporated into the grown epitaxial film (auto-doping), which results in variations in the resistivity on the surface of the epitaxial film.

SUMMARY OF THE INVENTION

An object of the invention is to provide a manufacturing method of an epitaxial silicon wafer that is capable of manufacturing an epitaxial silicon wafer in which the generation of SF in an epitaxial film is reduced and of leveling resistivity on a surface of the epitaxial film even with the use of a silicon wafer of extremely low resistivity, and an epitaxial silicon wafer.

After vigorous studies, the inventors of the present application have reached the following findings.

As described in Literature 2, it is observed that, on a substrate formed with a polysilicon film, SF generated after an epitaxial growth is originated from micropits (minute recesses) present on the surface of the silicon wafer before the epitaxial growth.

The micropits are not observed on a silicon wafer in which boron (B) as a p-type dopant is densely doped after being subjected to a prebaking treatment but are observed only when phosphorus (P) as an n-type dopant is added irrespective of the presence of germanium. Thus, it is speculated that it is highly likely that the generation of micropits is related to phosphorus densely doped in the crystals of the silicon wafer.

It is speculated that the micropits are generated according to the following mechanism. Specifically, oxygen and red phosphorus are present between crystal lattices of the silicon wafer before the formation of a polysilicon film. When the concentration of red phosphorus in the silicon wafer is raised in order to lower the substrate resistivity, supersaturated red phosphorus is present between the crystal lattices.

When the silicon wafer is heated for forming the polysilicon film in this state, since the diffusion rate of oxygen is greater than the diffusion rate of red phosphorus, oxygen moves through the lattices to be bonded with red phosphorus, whereby clusters (micro-precipitates) of oxygen and red phosphorus are formed.

Usually, prior to growing an epitaxial film in an epitaxial step, a heat treatment is applied on the silicon wafer in a hydrogen gas atmosphere for 30 seconds or more at a temperature of 1100 degrees C. or more in order to remove a natural oxidation film present on the surface of the silicon wafer (referred to as "hydrogen baking" hereinafter).

However, when the silicon wafer in which the clusters of oxygen and red phosphorus are formed is subjected to the hydrogen baking performed in the epitaxial step, though oxygen and red phosphorus in the outermost layer of the silicon wafer are out-diffused, since the clusters are stable, the clusters remain in the outermost layer. Then, due to a difference in an etching rate between the outermost layer of the silicon wafer and the clusters, the clusters are preferentially etched to provide the micropits by an etching effect of the hydrogen gas.

It is speculated that, when the silicon wafer provided with the micropits is subjected to an epitaxial growth, SF originated from the micropits are generated in the epitaxial film.

As described above, since the SF are generated due to the micropits originated from the clusters of oxygen and red phosphorus, it is believed that the generation of SF can be suppressed by not applying the polysilicon back seal in which a heating (related to the formation of clusters) is performed. Without a polysilicon film, gettering ability may be lowered. However, the gettering ability can be maintained by increasing the concentration of red phosphorus. Thus, it is supposed that the generation of SF can be restrained without lowering the gettering ability even without a polysilicon film.

However, it was found that, when the concentration of red phosphorus was further increased in order to adjust the substrate resistivity at 0.9 mΩ·cm or less, the generation of SF could not be restrained only without applying the polysilicon back seal, which is a result that has not been expected so far. In addition, when a distribution of SF in the longitudinal direction of the crystal was examined in detail in corresponding epitaxial wafers, it was found as shown in FIG. 1 that a part of the single crystal ingot with a solidification rate of less than approximately 60% had 10 or more number of SF per one square centimeter in a silicon wafer of 200 mm diameter (will be referred to simply as "SF number" hereinafter) and the SF number was 0 in another part with the solidification rate of more than the above level (i.e. approximately 60%) (an area encircled by dotted lines). In other words, it was found that the SF number was dependent on the solidification rate of the single crystal ingot.

Incidentally, the solidification rate refers to a ratio of pulled-up weight of the single crystal ingot relative to an initial charge weight of a dopant-added melt initially stored in a quartz crucible. The SF number was measured by observing an appearance of the defects with Magics manufactured by Lasertec Corporation.

However, it is preferable that as many products with substrate resistivity of 0.9 mΩ·cm or less as possible can be obtained from one single crystal ingot. The inventors studied the difference between the part with the solidification rate of less than approximately 60% and the part with the solidification rate of more than approximately 60% and noted that thermal hysteresis experienced by the crystal might have affected the SF number.

Thus, the inventors conducted experiments to examine a correlation between the solidification rate and the thermal hysteresis.

EXPERIMENT 1

Study on Relationship Between Solidification Rate/Thermal Hysteresis and SF Number In a manufacturing process of a usual single crystal ingot, a step for forming a shoulder continuous with a seed crystal and having a gradually increasing diameter (shoulder-formation step), a step for forming a straight body continuous with the shoulder and having a substantially constant diameter (straight-body-formation step) and a step for forming a tail continuous with a lower end of the straight body and having a diameter gradually reduced to zero (tail-formation step) are performed. After the tail-formation step is completed, a step for cooling the single crystal ingot (cooling step) is performed and the single crystal ingot is taken out of a pull-up device.

Since the single crystal ingot experiences the above manufacturing process, it is deduced that the time elapsed after being pulled out of the dopant-added melt becomes shorter toward a lower end of the single crystal ingot (i.e. as the solidification rate increases).

Initially, a single crystal ingot was manufactured according to the above manufacturing process and a residence time in each of temperatures (500±50 degrees C., 700±50 degrees C., 900±50 degrees C., 1100±50 degrees C.) for each of the solidification rates was measured. The results are shown in FIG. 2. It should be noted that red phosphorus (dopant) was added to the silicon melt to provide the dopant-added melt so that the substrate resistivity of silicon wafers became 0.9 mΩ·cm or less. In addition, a charge amount of the dopant-added melt was set at 100 kg as in a usual manufacturing process.

As shown in FIG. 2, it was found that, the residence time particularly at 500±50 degrees C. was extremely shorter in the section with more than 60% of the solidification rate (an area encircled by chain double-dashed lines) than in the section with the solidification rate of less than 60%.

In addition, silicon wafers corresponding to the plurality of solidification rates were cut out from the single crystal ingot to manufacture epitaxial silicon wafers, and the SF number of each of the epitaxial silicon wafers was examined. The results are shown in FIG. 2.

It should be noted that the results in FIG. 2 show the SF number formed on an epitaxial film under the same epitaxial growth conditions as in Experiment 3 (described later) on the silicon wafers without being provided with a polysilicon film on a backside thereof, the epitaxial film being formed after the silicon wafers were subjected to a hydrogen baking treatment in which the silicon wafers were heated at a temperature of 1200 degrees C. in a hydrogen gas atmosphere for 30 seconds.

As shown in FIG. 2, it was found that the SF number substantially correlates with the residence time of the single crystal ingot at the temperature of 500±50 degrees C. and the SF number became zero at a section where the solidification rate was more than 60%.

As described above, it was found that the generation of SF can be restrained by reducing the time for a single crystal ingot to be subjected to the temperature of 500±50 degrees C. In addition, it was found possible that clusters as a cause of the generation of SF were formed depending on the temperature during manufacture of the single crystal ingot.

Thus, it is speculated that the generation of SF can be restrained by reducing the time for a single crystal ingot to be subjected to the temperature of 500±50 degrees C. over a wide area of the single crystal ingot. However, it is believed easier to alter the post-process after manufacturing the single crystal ingot than to perform the above-described temperature control in a pull-up method in which a single crystal ingot is longitudinally pulled up.

Thus, the inventors of the present application conducted a research for restraining the generation of SF in the post-process even when clusters are formed during the manufacture process of a single crystal ingot.

EXPERIMENT 2

Research on Generation Status of LPD

Initially, LPD on a silicon wafer and LPD after applying a pit-evaluation heat treatment on the silicon wafer were evaluated.

Specifically, a silicon wafer satisfying the following substrate conditions and being taken from a section of a single crystal ingot with a solidification rate causing the SF generation (i.e. corresponding to the solidification rate causing SF) and another silicon wafer corresponding to the solidification rate not causing SF were prepared.
Substrate Conditions
Diameter: 200 mm
Substrate Resistivity: 0.8 mΩ·cm
(red phosphorus concentration: $9.47 \times 10^{19}$ atoms/cm$^3$)

Next, a polysilicon film satisfying the following polysilicon-film formation conditions was formed on a backside (a face opposite to a face on which an epitaxial film was formed) of each of the silicon wafers.
Polysilicon Film Formation Conditions
Film-forming method: CVD
Film-formation temperature: 650 degrees C.
Thickness of polysilicon film: 800 nm Further, a backside oxidation film satisfying the following backside-oxidation-film formation conditions was formed on the polysilicon film.
Backside-Oxidation-Film Formation Conditions
Film-forming method: CVD
Thickness of backside oxidation film: 550 nm Then, the polysilicon film and the backside oxidation film at an outer periphery of the silicon wafer were removed from the each of the silicon wafers provided with the polysilicon film and the backside oxidation film formed according to the above conditions for performing LPD evaluation. Incidentally, the LPD was evaluated according to the following LPD evaluation conditions.
LPD Evaluation Conditions
Used Apparatus: surface inspection system (SP-1 manufactured by KLA-Tencor Corporation)
Observation mode: DCN mode
Object to be measured: LPD of 90 nm or larger FIG. 3 shows measurements of the silicon wafer corresponding to the solidification rate causing SF generation. Though not illustrated herein, the measurements of the silicon wafer corresponding to the solidification rate not causing the SF generation were substantially the same as those shown in FIG. 3.

Additionally, the silicon wafers on which the polysilicon film and the backside oxidation film were formed according to the above conditions was subjected to a pit-evaluation heat treatment satisfying the following conditions. The pit-evaluation heat treatment conditions were determined to simulate a hydrogen baking heat treatment performed during the formation of the epitaxial film.
Pit-Evaluation Heat Treatment Conditions
Atmosphere: hydrogen gas
Heat treatment temperature: 1200 degrees C.
Heat treatment time: 30 seconds Then, the LPD evaluation of each of the silicon wafers after being subjected to the pit-evaluation heat treatment according to the above-described conditions was performed according to the above-described LPD evaluation conditions in Experiment 2. The results are shown in FIGS. 4 and 5.

As shown in FIG. 4, it was found that LPD 101 increased after the pit-evaluation heat treatment in one of silicon wafers 100 corresponding to the solidification rate causing the SF generation. On the other hand, as shown in FIG. 5, it was found that the LPD 101 kept substantially unchanged before and after the pit-evaluation heat treatment in another one of the silicon wafers 100 corresponding to the solidification rate not causing the SF generation.

When the silicon wafer shown in FIG. 4 in which LPD was increased was observed with an AFM (Atomic Force Microprobe), it was found that the LPD was a pit P as shown in FIG. 6. In other words, it was found that the pit P generated after the pit-evaluation heat treatment could be measured as the LPD of 90 nm or larger in the DCN mode of SP-1 manufactured by KLA-Tencor Corporation.

EXPERIMENT 3

Research on Generation Status of LPD Before and after Epitaxial Film Growth

In the above Experiment 2, the silicon wafer corresponding to the solidification rate causing SF generation as shown in FIG. 4 was subjected to the following hydrogen baking treatment. Subsequently, an epitaxial film satisfying the following epitaxial film growth conditions was formed on a surface of the silicon wafer to prepare an epitaxial silicon wafer.
Hydrogen Baking Treatment Conditions
Atmosphere: hydrogen gas
Heat treatment temperature: 1200 degrees C.
Heat treatment time: 30 seconds
Epitaxial Film Growth Conditions
Dopant gas: phosphine (PH$_3$) gas
Material source gas: trichlorosilane (SiHCl$_3$) gas
Carrier gas: hydrogen gas
Growth temperature: 1080 degrees C.
Thickness of epitaxial film: 3 μm
Resistivity (epitaxial film resistivity): 1 Ω·cm
(red phosphorus concentration: $4.86 \times 10^{15}$ atoms/cm$^3$)

Then, the LPD evaluation of the epitaxial silicon wafer prepared according to the above-described conditions was performed according to the LPD evaluation conditions in Experiment 2. In addition, the LPD evaluation results of the epitaxial silicon wafer were overlapped with the LPD evaluation results of the surface of the silicon wafer after being subjected to the pit-evaluation heat treatment in the experiment shown in FIG. 4 (i.e. before growing the epitaxial film) for comparison. The results are shown in FIG. 7. In addition, distribution of LPD in an area encircled by chain double-dashed lines in FIG. 7 is shown in FIG. 8 in an enlarged manner.

As shown in FIG. 7, it was found that many LPD were generated in an annular area A1 at a distance of approximately 2 to 6 cm from an outer edge of the epitaxial silicon wafer. Further, as shown in FIG. 8, it was found that points of LPD before and after the growth of the epitaxial film substantially coincide with each other.

In addition, in the LPD-generated points on the epitaxial silicon wafer, the points at which LPD had generated before growing the epitaxial film were evaluated according to the following LPD evaluation conditions.

LPD Evaluation Conditions

Used Apparatus: Surface inspection system (Magics manufactured by Lasertec Corporation)

As a result, it was found that flat-type SF of a rectangular plan and triangular cross section (i.e. substantially quadrangular pyramid having a bottom face substantially flush with a surface of the epitaxial film and an apex recessed toward the silicon wafer) were generated at the evaluated points.

EXPERIMENT 4

Study on Relationship Between Substrate Resistivity and Generated SF Number

Silicon wafers which had substrate resistivity of 0.6 mΩ·cm, 0.7 mΩ·cm, 0.8 mΩ·cm, 0.9 mΩ·cm, 1.0 mΩ·cm, 1.1 mΩ·cm, 1.3 mΩ·cm and 1.5 mΩ·cm were prepared. Then, a polysilicon film and a backside oxidation film were formed on each of the silicon wafers under the same conditions as in the above Experiment 2. Subsequently, an epitaxial film was formed thereon to provide an epitaxial silicon wafer under the same conditions as in the above Experiment 3 except that the thickness was changed to 5 μm.

The SF number of the epitaxial silicon wafer was evaluated with a surface inspection system (Magics manufactured by Lasertec Corporation). The results are shown in FIG. 9.

As shown in FIG. 9, when the substrate resistivity was 1.0 mΩ·cm or more, the SF number was less than 10 per square centimeter. However, when the substrate resistivity was 0.9 mΩ·cm or less, the SF number increased to 20 per square centimeter or more.

According to the above, it is speculated that SF has to be reduced in order to reduce LPD. Especially, when the substrate resistivity of the silicon wafer is 0.9 mΩ·cm or less, it is believed some measures have to be taken in order to reduce the number of SF.

It is believed that micropits generated after the hydrogen baking treatment needs to be reduced in order to reduce the number of SF. In order to reduce the micropits, it is believed that a treatment for eliminating clusters has to be applied before the hydrogen baking treatment in which the clusters are generated.

Thus, the inventors have conducted a research on the possibility for reducing the number of SF by eliminating or reducing the clusters by a solution treatment.

EXPERIMENT 5

Research on Effectiveness of Argon Annealing for Reducing SF

A backside oxidation film was formed on a backside of a silicon wafer with a substrate resistivity of 0.8 mΩ·cm under the same conditions as in the above Experiment 2. Then, an argon annealing was applied on the silicon wafer under the following argon annealing conditions.

Argon Annealing Conditions

Atmosphere: argon gas

Heat treatment temperature: 1200 degrees C.

Heat treatment time: six levels (0 minute, 30 minutes, 60 minutes, 90 minutes, 120 minutes and 180 minutes)

Then, a heat treatment according to the hydrogen baking treatment conditions in the above Experiment 2 was applied on the surface of the silicon wafers having experienced the six-level argon annealing under the above conditions. Subsequently, an epitaxial film was formed thereon to provide an epitaxial silicon wafer under the same conditions as in the above Experiment 3 except that the thickness was changed to 5 μm. Then, the SF number of the epitaxial silicon wafer was evaluated according to the same conditions as in the above Experiment 4. The results are shown in FIG. 10.

As shown in FIG. 10, it was found that the SF number was reduced to one per square centimeter or less by applying an argon annealing treatment at 1200 degrees for sixty minutes or more.

In addition, the SF number was counted for the six-level epitaxial silicon wafers applied with the argon annealing under the same conditions as in the above Experiment 5 except that the heat treatment temperature was changed to 1220 degrees C. As a result, it was found that substantially the same effects as in FIG. 10 could be obtained.

Further, it was found that, when similar evaluation on the SF number was performed after changing the heat treatment temperature to 1180 degrees C., the SF number exceeded one per square centimeter irrespective of the heat treatment time.

According to the above, it is speculated that the clusters were eliminated or reduced by solution treatment by the argon annealing at the heat treatment temperature of 1200 degrees or higher for sixty minutes or more before the hydrogen baking treatment. It is thus speculated that the SF number is reduced by applying the hydrogen baking treatment and the epitaxial film growth treatment on the silicon wafer in which the clusters are eliminated or reduced.

EXPERIMENT 6

Research on Effect of Argon Annealing on Uniformity of In-Plane Resistivity in Epitaxial Silicon Wafer The epitaxial silicon wafers having experienced argon annealing at 1200 degrees C. for the heat treatment time of 0, 60 and 120 minutes in Experiment 5 were examined in terms of resistivity distribution in the plane of the epitaxial film. The results are shown in FIG. 11.

As shown in FIG. 11, the longer the heat treatment time, the higher the resistivity at the outer periphery of the epitaxial film became and the more uniformly the resistivity distributed in the plane.

Further, the uniformity of the resistivity $\Delta\rho$ ($\Delta\rho$=(maximum−minimum)/(2×average)×100%) was evaluated to be found as follows.

Heat treatment time . . . 0 minute: 9.6%

Heat treatment time . . . 60 minutes: 1.9%

Heat treatment time . . . 120 minutes: 1.1%

It is speculated that this is because, without the argon annealing, the epitaxial growth occurs while the concentration of red phosphorus on the surface of the silicon wafer is high, so that auto-doping of red phosphorus from the surface uncovered by the backside oxidation film occurs to deteriorate the uniformity of the resistivity distribution. In contrast, it is speculated that, with the argon annealing, since the red phosphorus on the surface of the silicon wafer out-diffuses by the argon annealing to lower the concentration of red phosphorus, the occurrence of the auto-doping is restrained to enhance the uniformity of resistivity distribution.

The invention has been reached based on the above findings.

A manufacturing method according to an aspect of the invention is of an epitaxial silicon wafer provided by forming an epitaxial film on a surface of a silicon wafer added with phosphorus so that resistivity of the silicon wafer falls at or below 0.9 mΩ·cm, the method including: forming an oxidation film on a backside of a silicon wafer cut out from a single crystal ingot prepared by a Czochralski process; removing the oxidation film present at an outer periphery of the silicon wafer; argon annealing in which a heat treatment is applied on the silicon wafer after removing the oxidation film in an argon gas atmosphere at a temperature in a range from 1200 to 1220 degrees C. for 60 minutes or more and 120 minutes or less; and forming the epitaxial film on the surface of the silicon wafer after applying the argon annealing.

According to the above aspect of the invention, even with the use of silicon wafers having resistivity of 0.9 mΩ·cm or less, the above-mentioned argon annealing applies a solution treatment to the clusters. Thus, high-quality epitaxial silicon wafers of which SF number is less than one per square centimeter can be produced. Further, the argon annealing out-diffuses the red phosphorus on the surface of the silicon wafers, so that the auto-doping caused by the red phosphorus present on the surface of the silicon wafers can be prevented. In addition, since the heat treatment is performed in an argon gas atmosphere, an oxidation film (backside oxidation film) is not removed due to a reduction action unlike an instance in which a heat treatment is applied in the presence of hydrogen gas. Furthermore, the heat treatment keeps the clusters of red phosphorus and oxygen from being eminently observed as micropits.

Further, since the oxidation film is formed on the backside of the silicon wafer, the auto-doping due to the presence of red phosphorus on the backside can be restrained. Additionally, since the epitaxial film is formed after removing the oxidation film at the outer periphery of the silicon wafers, nodules (minute projections caused by abnormal growth of polysilicon) can be kept from being generated at the outer periphery.

Further additionally, since the argon annealing step is performed after performing the backside-oxidation-film-removal step, the following exemplary advantages can be achieved. If the backside-oxidation-film-removal step is performed after the argon annealing step, since the oxidation film remains at the outer periphery of the silicon wafers at the start of the argon annealing, the out-diffusion of the red phosphorus at the outer periphery covered with the oxidation film is restrained. When the epitaxial film is formed after the oxidation film at the outer periphery is removed, the red phosphorus present at the outer periphery may cause auto-doping. In contrast, when argon annealing step is performed after the backside-oxidation-film-removal step, the red phosphorus at the outer periphery uncovered by the oxidation film can be out-diffused. Thus, the auto-doping from the outer periphery can be restrained when the epitaxial film is formed after the argon annealing.

In the manufacturing method of an epitaxial silicon wafer according to the above aspect of the invention, it is preferable that a pit-evaluation heat treatment is performed on an evaluation silicon wafer cut out from the single crystal ingot, all of steps from the forming of the oxidation film on the backside to the forming of the epitaxial film being performed on the silicon wafer cut out from a section including a cut point of the evaluation silicon wafer when micropits are observed on a surface of the evaluation silicon wafer.

In the manufacturing method of an epitaxial silicon wafer according to the above aspect of the invention, it is preferable that a pit-evaluation heat treatment is performed on an evaluation silicon wafer cut out from the single crystal ingot, all of steps from the forming of the oxidation film on the backside to the forming of the epitaxial film except for the argon annealing being performed on the silicon wafer cut out from a section including a cut point of the evaluation silicon wafer when pits are not observed on a surface of the evaluation silicon wafer.

The pit-evaluation heat treatment herein may be performed under the above-described heat treatment conditions simulating the hydrogen baking heat treatment conditions performed during the epitaxial step. Typically, the pit-evaluation heat treatment is exemplarily performed under heat treatment conditions of 1200 degrees C. for 30 seconds in a hydrogen gas atmosphere. With the heat treatment conditions simulating the hydrogen baking heat treatment conditions, when an evaluation silicon wafer is cut out from a section of a single crystal ingot in which a large number of clusters are generated and the evaluation silicon wafer is subjected to the pit-evaluation heat treatment, pits are observed on the surface of the silicon wafers, so that it can be concluded that the clusters are also generated in the section of the single crystal ingot including the evaluation silicon wafer.

On the other hand, when an evaluation silicon wafer taken from another section of the single crystal ingot in which the clusters are not generated is subjected to the pit-evaluation heat treatment, micropits are not observed on the surface of the silicon wafers, so that it can be concluded that the clusters are also not generated in the section of the single crystal ingot including the evaluation silicon wafer.

Incidentally, it is found as a result of observation of the micropits generated on the silicon wafer with an AFM that the diameters (approximately in a range from 300 nm to 500 nm) and depths (approximately in a range from 2.0 nm to 5.5 nm) of the micropits are substantially constant. Further, the number of micropits is substantially the same as the SF number.

Thus, the above phrase "when micropits are observed" refers to an instance in which there are one or more micropits of a diameter of 500 nm or more per one square centimeter (314 or more per one silicon wafer of 200 mm diameter). Conversely, the phrase "when micropits are not observed" refers to an instance when the above conditions are not met.

According to the above arrangement, since the pit-evaluation heat treatment is applied on the evaluation silicon wafer cut out from a single crystal ingot, the section of the single crystal ingot in which the clusters are generated can be estimated at the stage of manufacturing the single crystal ingot. Thus, high-quality epitaxial silicon wafers in which the generation of SF is restrained can be manufactured by selectively performing the entire process including the argon annealing step onto the silicon wafer(s) obtained from the section estimated to include the clusters.

In addition, high-quality epitaxial silicon wafers in which the generation of SF is restrained can be efficiently manufactured by selectively performing the process except for the argon annealing step onto the silicon wafer(s) obtained from the section estimated not to include the clusters.

Additionally, according to the above-described Experiment 1, the inventors have found that the generation of SF, in other words, the generation of clusters while manufacturing the single crystal ingot can be restrained by reducing the time for the single crystal ingot to be subjected to the temperature of 500 degrees C. Accordingly, it was investigated that which specific temperature conditions for heating the section of the single crystal ingot restrained the generation of clusters.

EXPERIMENT 7

Study on Temperature Condition Capable of Reducing Generation of SF

After manufacturing a single crystal ingot under the same conditions as those in Experiment 1, without starting a cooling step, the pull-up of the single crystal ingot was suspended for 10 hours while the tail was out of a dopant-added melt and the single crystal ingot was kept being heated in the heating condition during a tail-formation step. During the suspension, the temperature distribution at the center of the single crystal ingot for each of the solidification rates was as shown in FIG. 12.

Subsequently, after the single crystal ingot was taken out from a pull-up device after elapsing 10 hours, epitaxial silicon wafers were manufactured under the same condition as in Experiment 1 (i.e. epitaxial film was formed after applying a pre-baking treatment in a hydrogen atmosphere at 1200 degrees C. for 30 seconds on a silicon wafer obtained from the single crystal ingot). Then, the relationship between the number of LPD per each of epitaxial silicon wafers of 200 mm diameter (simply referred to as "LPD number" hereinafter) and the solidification rate was examined. The results are shown in FIG. 13.

Herein, the LPD number was measured with DCN mode of SP-1 manufactured by KLA-Tencor Corporation. The LPD to be measured was those with the size of 90 nm or more. Further, since there is a good correlation between the LPD number and the SF number, the LPD number was substituted by the SF number.

As shown in FIG. 13, it was found that the LPD number rapidly increased from a point at which the solidification rate was approximately 52%, was maximized approximately at 62% and was substantially 0 when the solidification rate exceeded 70%. It was also found that the temperature at the point at which the solidification rate was approximately 52% (i.e. the temperature at which rapid increase of the LPD number started) was approximately 470 degrees C.; the temperature at the point at which the solidification rate was approximately 62% (i.e. the temperature at which the LPD number was maximized) was approximately 570 degrees C.; and the temperature at the point at which the solidification rate was approximately 70% (i.e. the temperature at which the LPD number became substantially zero) was approximately 700 degrees C.

According to the above results, it was found that SF was likely to be generated when the temperature of the single crystal ingot was kept for a long time approximately at 470 to 700 degrees C., especially approximately at 570 degrees C.

Next, a tolerable range relative to a central temperature was determined.

Specifically, based on the experimental results in the above FIG. 13, a residence time at each of temperatures (550±30 degrees C., 570±30 degrees C. and 600±30 degrees C.) for each of corresponding solidification rates was examined. The results are shown in FIG. 14. Additionally, the residence time at each of temperatures 550±50 degrees C., 570±50 degrees C. and 600±50 degrees C. is shown in FIG. 15 and the residence time at each of temperatures 550±70 degrees C., 570±70 degrees C. and 600±70 degrees C. is shown in FIG. 16.

As shown in FIGS. 14 to 16, it was found that an increase width of the residence time at each of temperatures 550±70 degrees C., 570±70 degrees C. and 600±70 degrees C. (i.e. horizontal length in the figure) and an increase width of the LPD number (i.e. horizontal length in the figure) substantially coincided with each other.

Thus, it was found that LPD was likely to be generated when the temperature of the single crystal ingot was kept for a long time at 570±70 degrees C.

Additionally, the inventors examined in order not to generate LPD how long time is tolerable for the single crystal ingot to be kept at a temperature in the range of 570±70 degrees C.

Initially, after performing the tail-formation step under the same conditions as in Experiment 1, the single crystal ingot was gradually cooled as shown in solid lines in FIG. 17 without rapidly cooling in a usual cooling step as shown in chain double-dashed lines in FIG. 17. It should be noted that ordinate axis in FIG. 17 represents a residence time in a temperature range of 650±50 degrees C.

Then, with the use of the single crystal ingot manufactured according to the conditions represented by the solid lines in FIG. 17, epitaxial silicon wafers were manufactured under the same conditions as in Experiment 1 to examine the LPD number in each of the solidification rates. The relationship between the residence time in each of the solidification rates and the LPD number is shown in FIG. 18. It should be noted that ordinate axis in FIG. 18 represents a residence time in a temperature range of 570±70 degrees C.

As shown in FIG. 18, it was found that the LPD number became 0 when the solidification rate exceeded approximately 66%. It was also found that the residence time in the temperature range of 570±70 degrees C. at this time was approximately 200 minutes.

Thus, it is speculated that it is possible to restrain the generation of LPD by reducing the time for a single crystal ingot to be at the temperature of 570±70 degrees C. to 200 minutes or less.

Next, an experiment for verifying the experimental results in FIG. 18 was conducted.

After performing the tail-formation step under the same conditions as in Experiment 1, a usual cooling step as shown in chain double-dashed lines in FIG. 17 was performed to manufacture a single crystal ingot under usual conditions. Then, with the use of the single crystal ingot, epitaxial silicon wafers were manufactured under the same conditions as in Experiment 1 to examine the LPD number in each of the solidification rates. The results are shown in FIG. 19.

As shown in FIG. 19, it was found that, when the solidification rate was over approximately 44%, the time for the single crystal ingot to be in the temperature range of 570±70 degrees C. became from 20 to 200 minutes and the LPD number was reduced.

Thus, it is found that it is possible to restrain the generation of LPD by setting the time for a single crystal ingot to be at the temperature of 570±70 degrees C. in a range from 20 to 200 minutes. In other words, it is found that, when the time for a single crystal ingot to be at the temperature of 570±50 degrees C. exceeds 200 minutes, the generation of clusters cannot be restrained, and, consequently, the generation of LPD cannot be restrained.

In other words, in the manufacturing method of an epitaxial silicon wafer according to the above aspect of the invention, it is preferable that the silicon wafer cut out from the single crystal ingot is cut out from a section of the single crystal ingot that has been heated in a temperature range from 570±70 degrees C. for more than 200 minutes during a manufacturing process of the single crystal ingot.

According to the above arrangement, since a part of the single crystal ingot to be subjected to the argon annealing can be discriminated from another part of the single crystal ingot not to be subjected to the argon annealing, a high-quality epitaxial silicon wafer can be efficiently manufactured.

In the manufacturing method of an epitaxial silicon wafer according the above aspect of the invention, it is preferable that a resistivity of the silicon wafer is less than 0.8 mΩ·cm.

In the manufacturing method of an epitaxial silicon wafer according the above aspect of the invention, it is preferable that the resistivity of the silicon wafer is 0.6 mΩ·cm or more.

When phosphorus is doped so that the resistivity of the silicon wafer becomes less than 0.6 mΩ·cm, the single crystal ingot itself cannot be grown.

In the manufacturing method of an epitaxial silicon wafer according the above aspect of the invention, it is preferable that the single crystal ingot is manufactured by the Czochralski process with an addition of germanium so that a concentration of the germanium in the silicon wafer falls within a range from $3.70 \times 10^{19}$ atoms/cm$^3$ to $2.93 \times 10^{20}$ atoms/cm$^3$.

According to the above arrangement, occurrence of dislocation defect (misfit dislocation) due to red-phosphorus concentration difference at an interface between the silicon wafer and the epitaxial film can be restrained.

An epitaxial silicon wafer according to another aspect of the invention includes: a silicon wafer added with phosphorus so that resistivity of the silicon wafer falls at or below 0.9 mΩ·cm; an epitaxial film formed on a first side of the silicon wafer; and an oxidation film formed on a second side of the silicon wafer opposite to the first side, in which an average number of Light Point Defect of a size of 90 nm or more observed on a surface of the epitaxial film is one or less per square centimeter.

DESCRIPTION OF EMBODIMENT(S)

Exemplary embodiment(s) of the invention will be described below with reference to the attached drawings.

Figure 1:
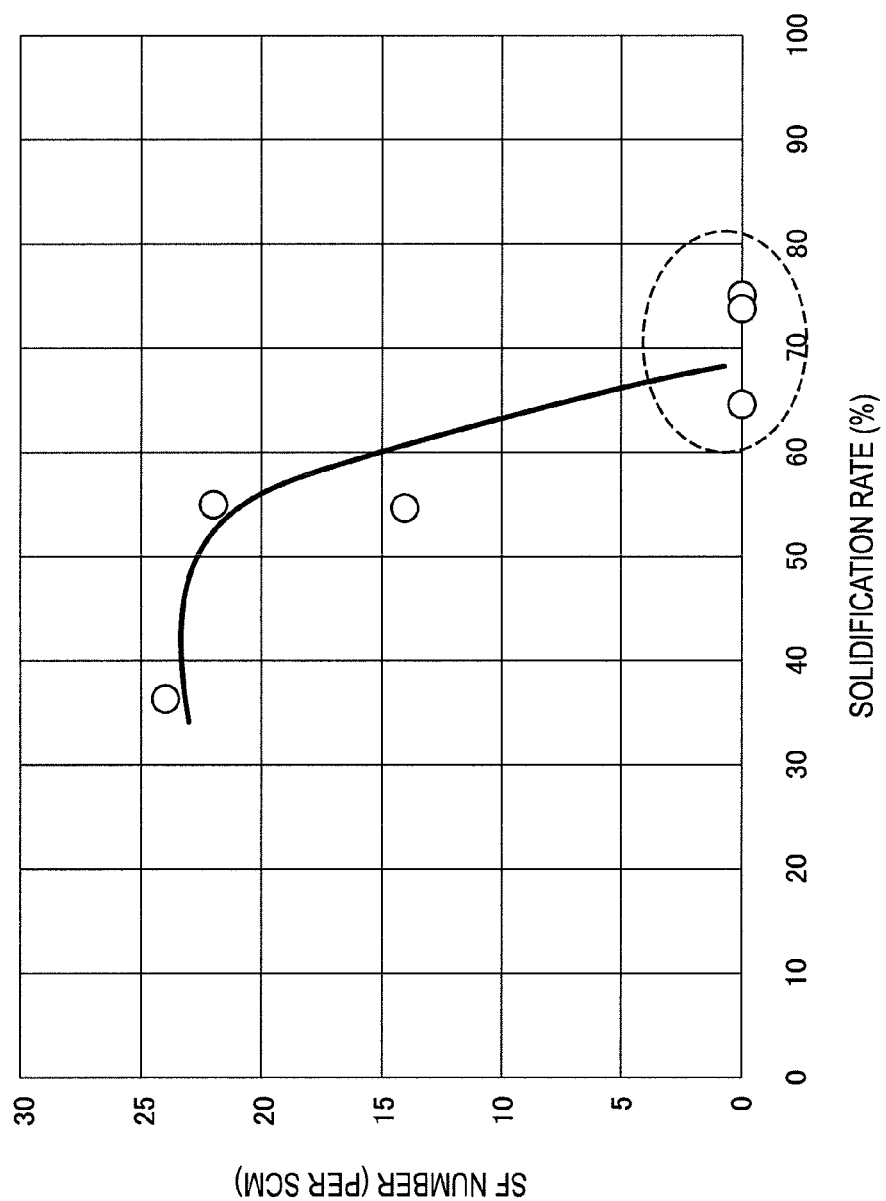
FIG. 1 is a graph showing results of an experiment for deriving a manufacturing condition of an epitaxial silicon wafer according to the invention, which shows a relationship between a solidification rate of a single crystal ingot and an SF number.
Figure 2:
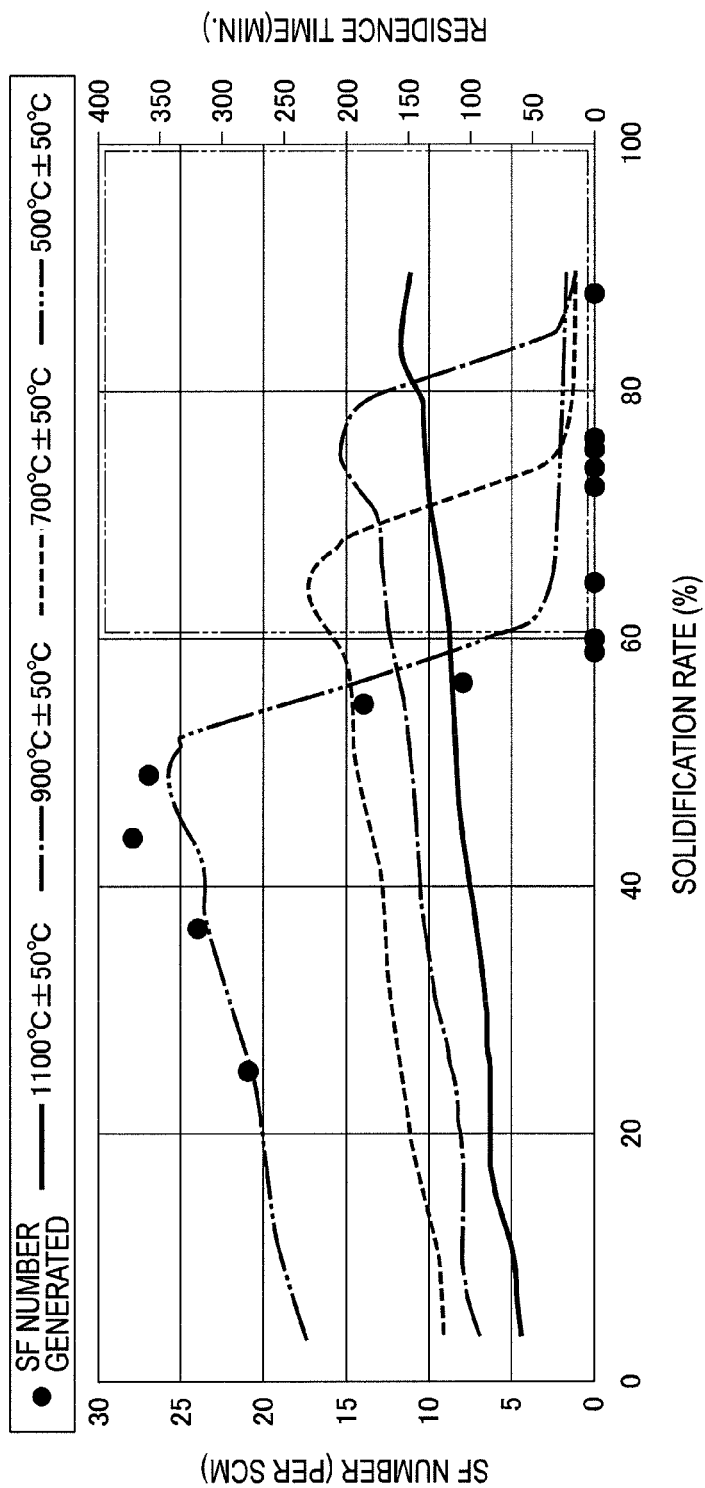
FIG. 2 is another graph showing results of Experiment 1 for deriving the manufacturing condition, which shows a relationship between the solidification rate, the SF number and a residence time at each of temperatures.
Figure 3:
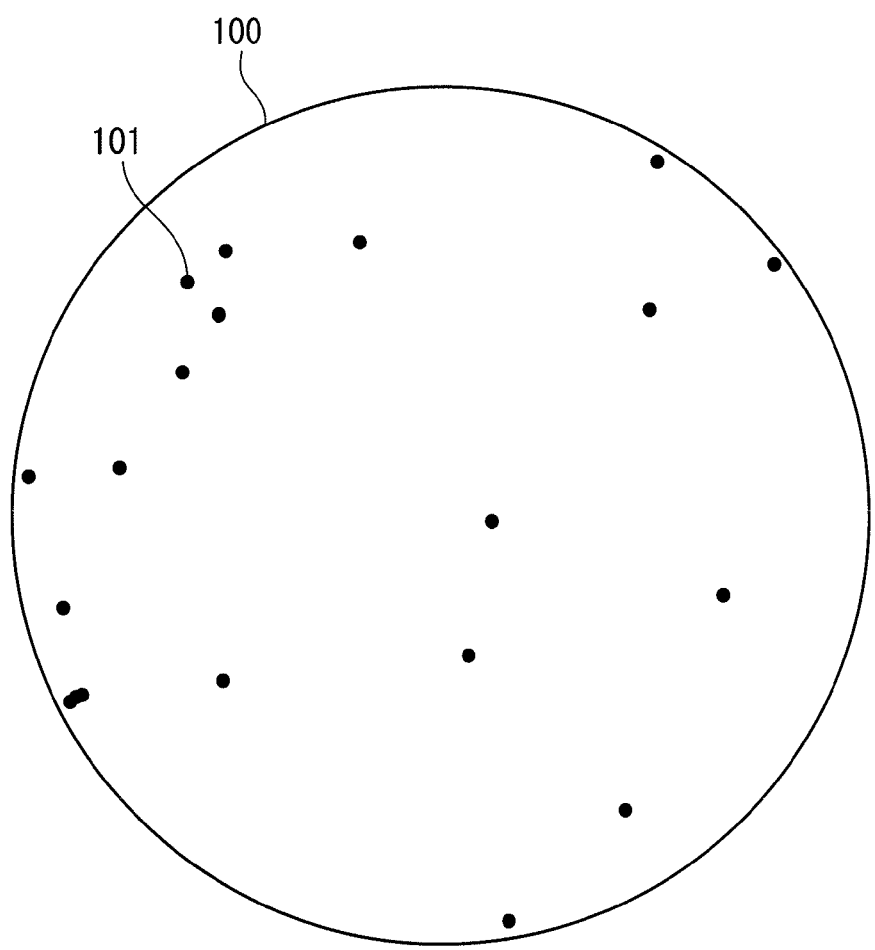
FIG. 3 shows results of Experiment 2 showing a generation state of LPD on a silicon wafer before a pit-evaluation heat treatment.
Figure 4:
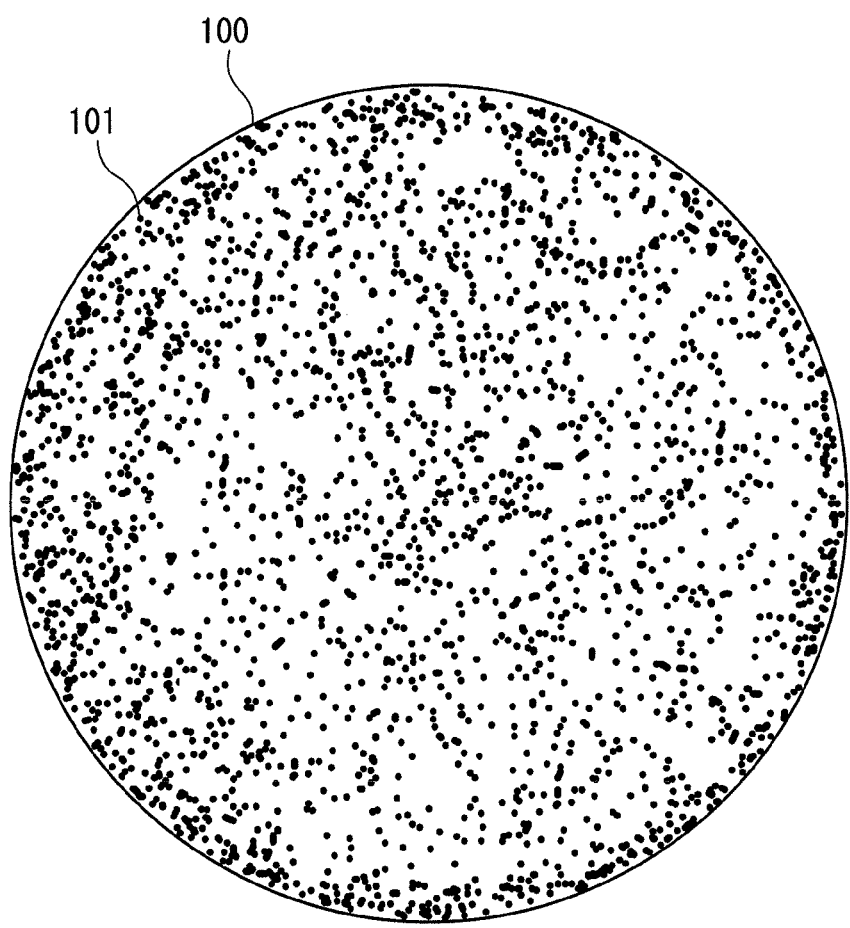
FIG. 4 shows the results of Experiment 2 showing a generation state of LPD after the pit-evaluation heat treatment on a silicon wafer corresponding to a solidification rate at which SF are generated.
Figure 5:
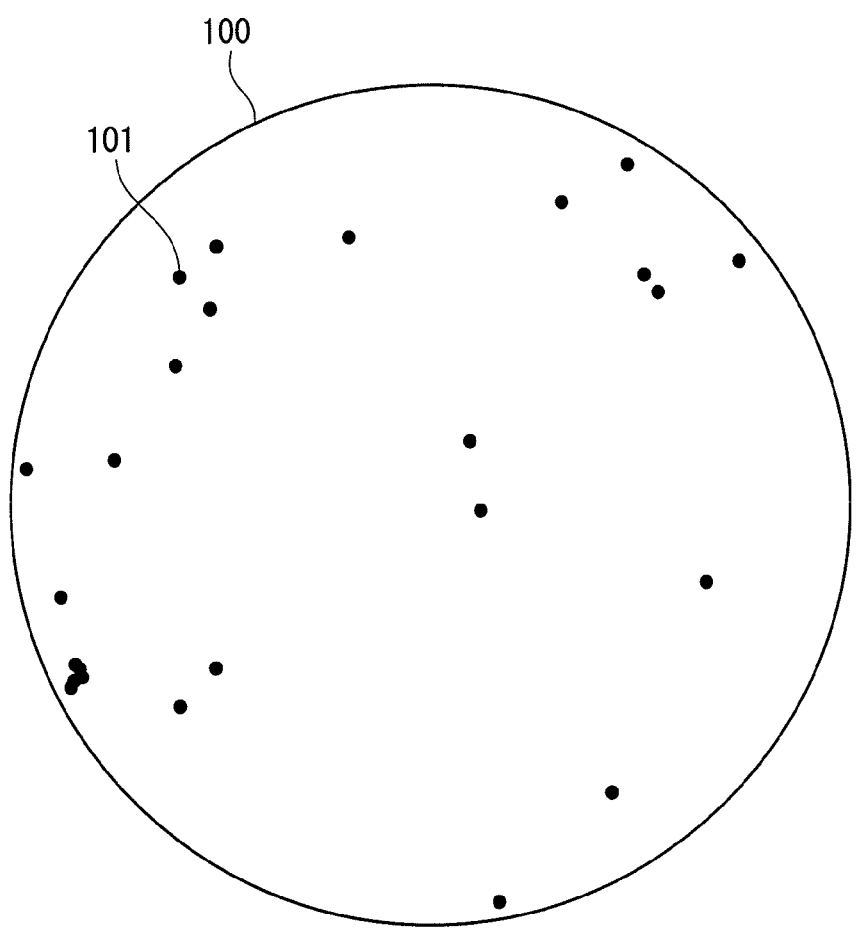
FIG. 5 shows the results of Experiment 2 showing a generation state of LPD after the pit-evaluation heat treatment on a silicon wafer corresponding to a solidification rate at which SF are not generated.
Figure 6:
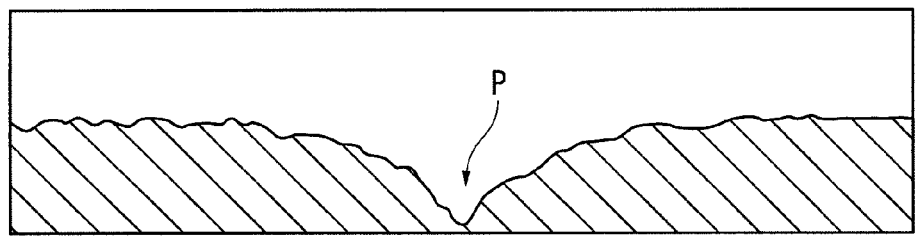
FIG. 6 shows the results of Experiment 2 showing AFM observation results of LPD on a silicon wafer increased after the pit-evaluation heat treatment.
Figure 7:
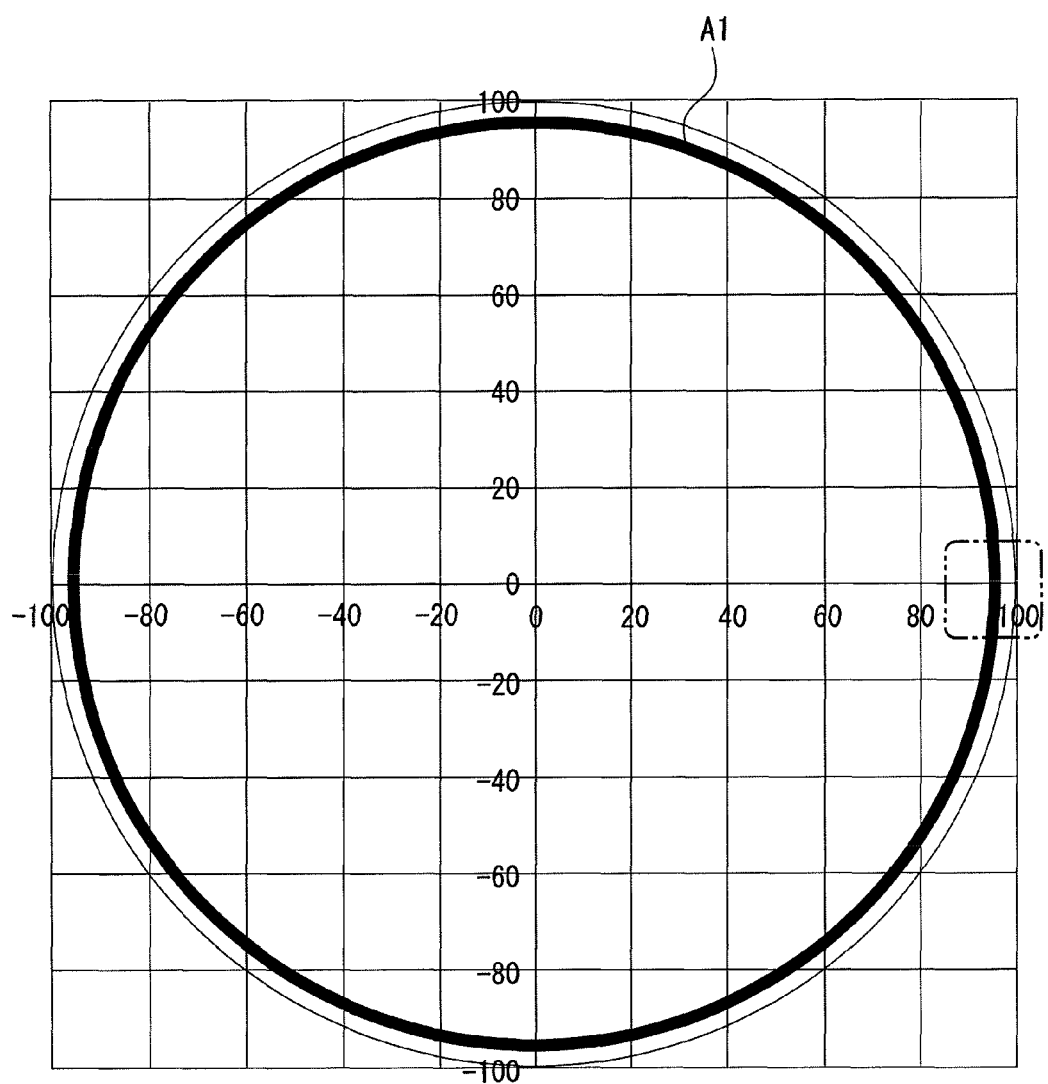
FIG. 7 shows results of Experiment 3 for deriving the manufacturing condition, which shows an LPD generation state after growing an epitaxial film and experimental results shown in FIG. 4 in an overlapped manner.
Figure 8:
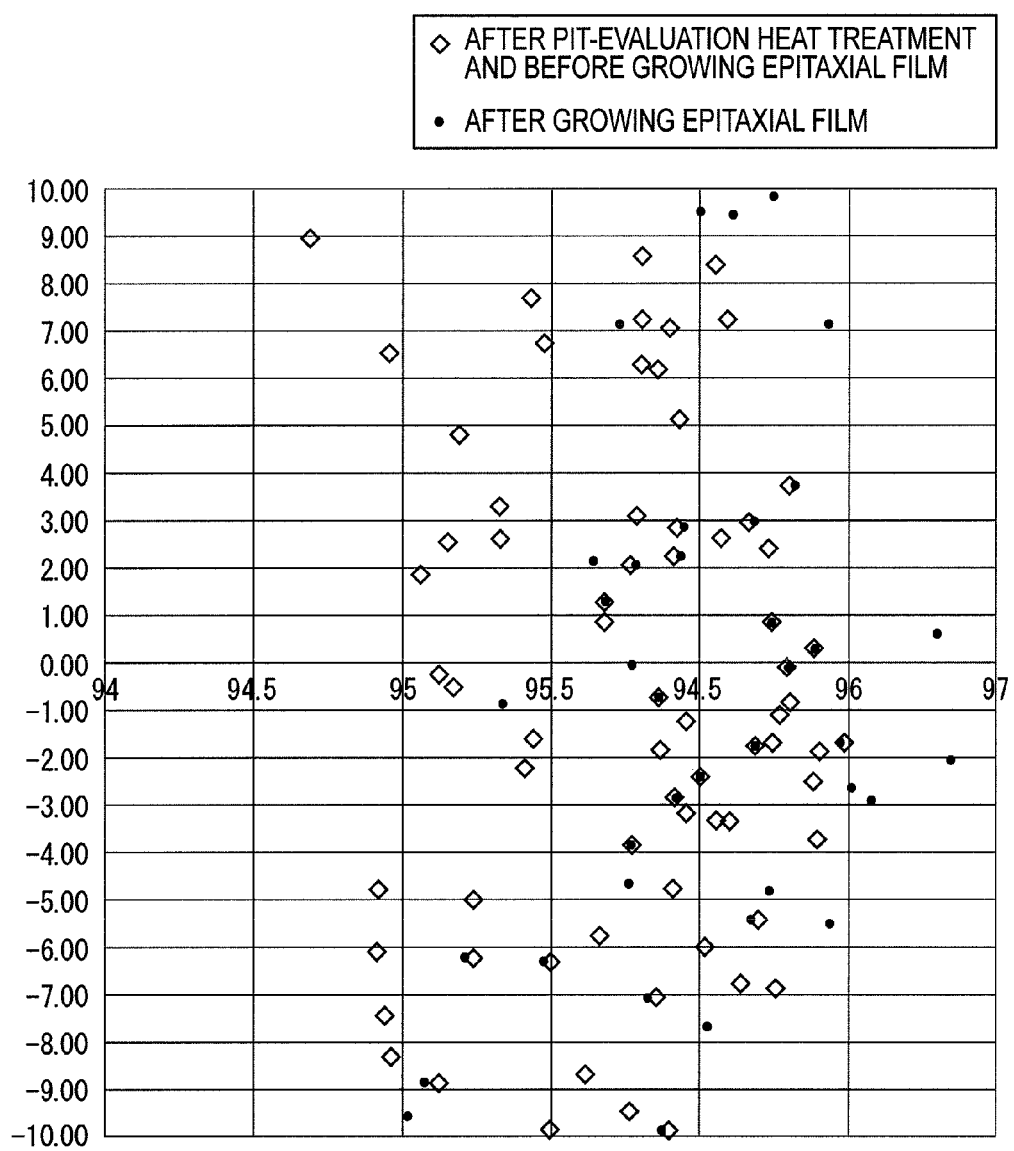
FIG. 8 shows results of Experiment 3, which shows a part of FIG. 7 in an enlarged manner.
Figure 9:
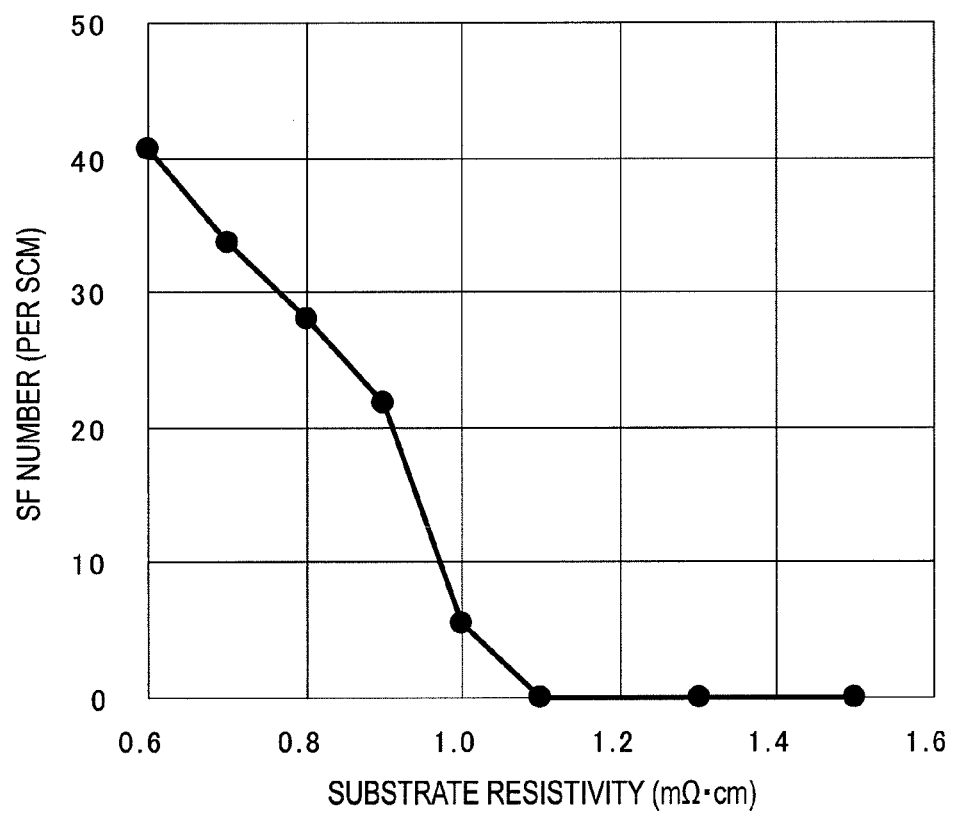
FIG. 9 is a graph showing results of Experiment 4 for deriving the manufacturing condition, which shows a correlation between a substrate resistivity and the number of SF generated.
Figure 10:
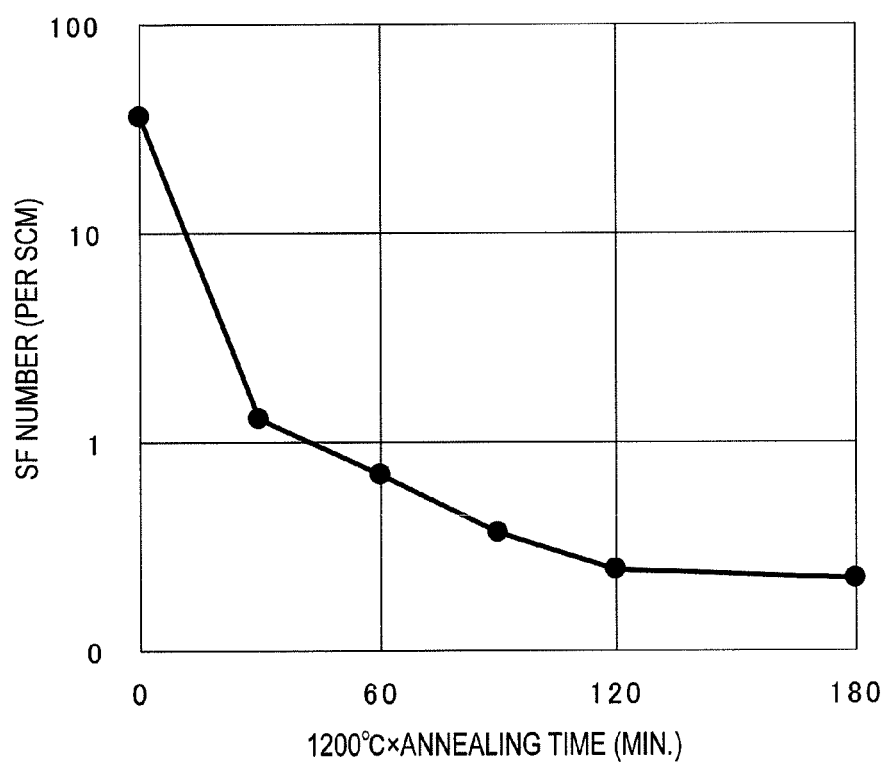
FIG. 10 is a graph showing results of Experiment 5 for deriving the manufacturing condition, which shows a correlation between an argon annealing time and the number of SF generated.
Figure 11:
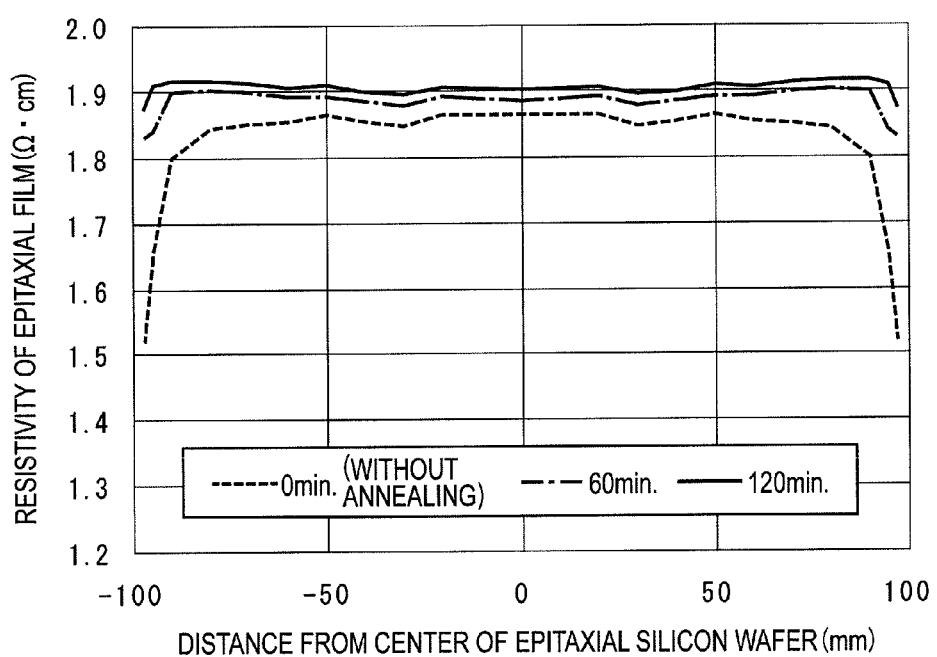
FIG. 11 is a graph showing results of Experiment 6 for deriving the manufacturing condition, which shows a correlation between a distance from a center of an epitaxial silicon wafer and resistivity of an epitaxial film.
Figure 12:
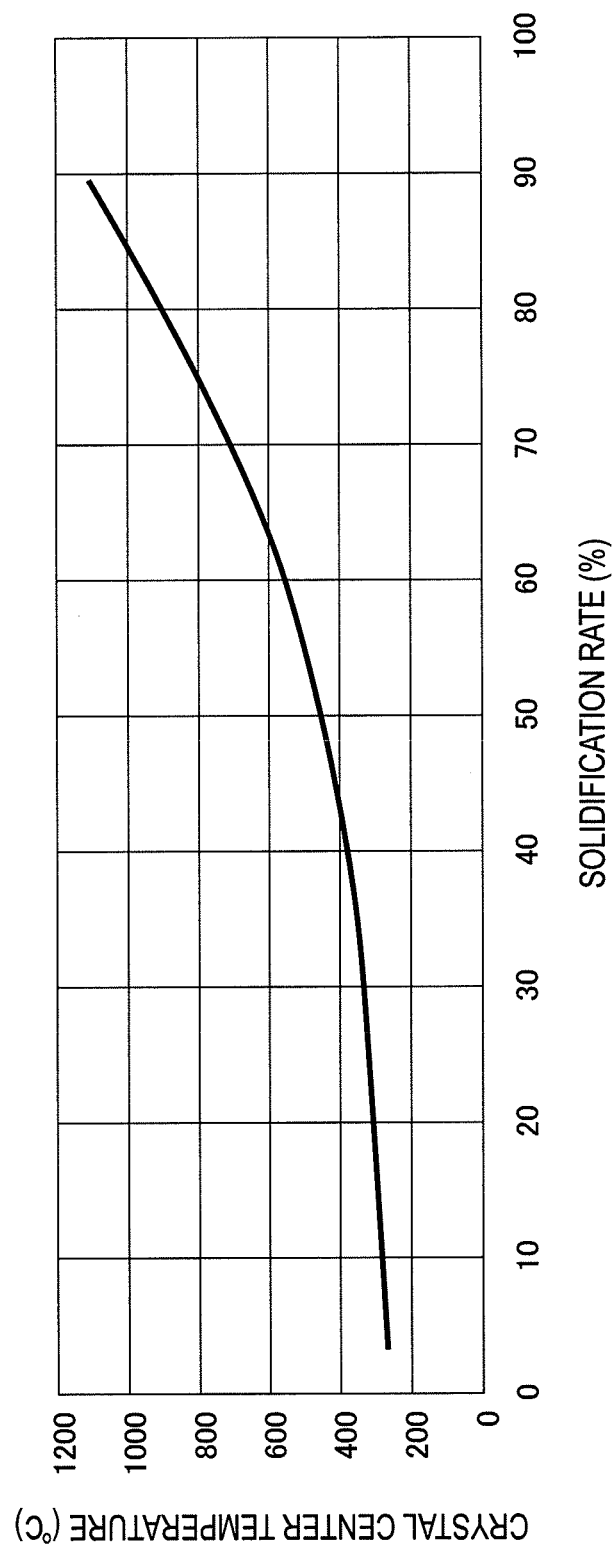
FIG. 12 is a graph showing results of Experiment 7 for deriving the manufacturing condition, which shows a relationship between the solidification rate and a center temperature of the crystal.
Figure 13:
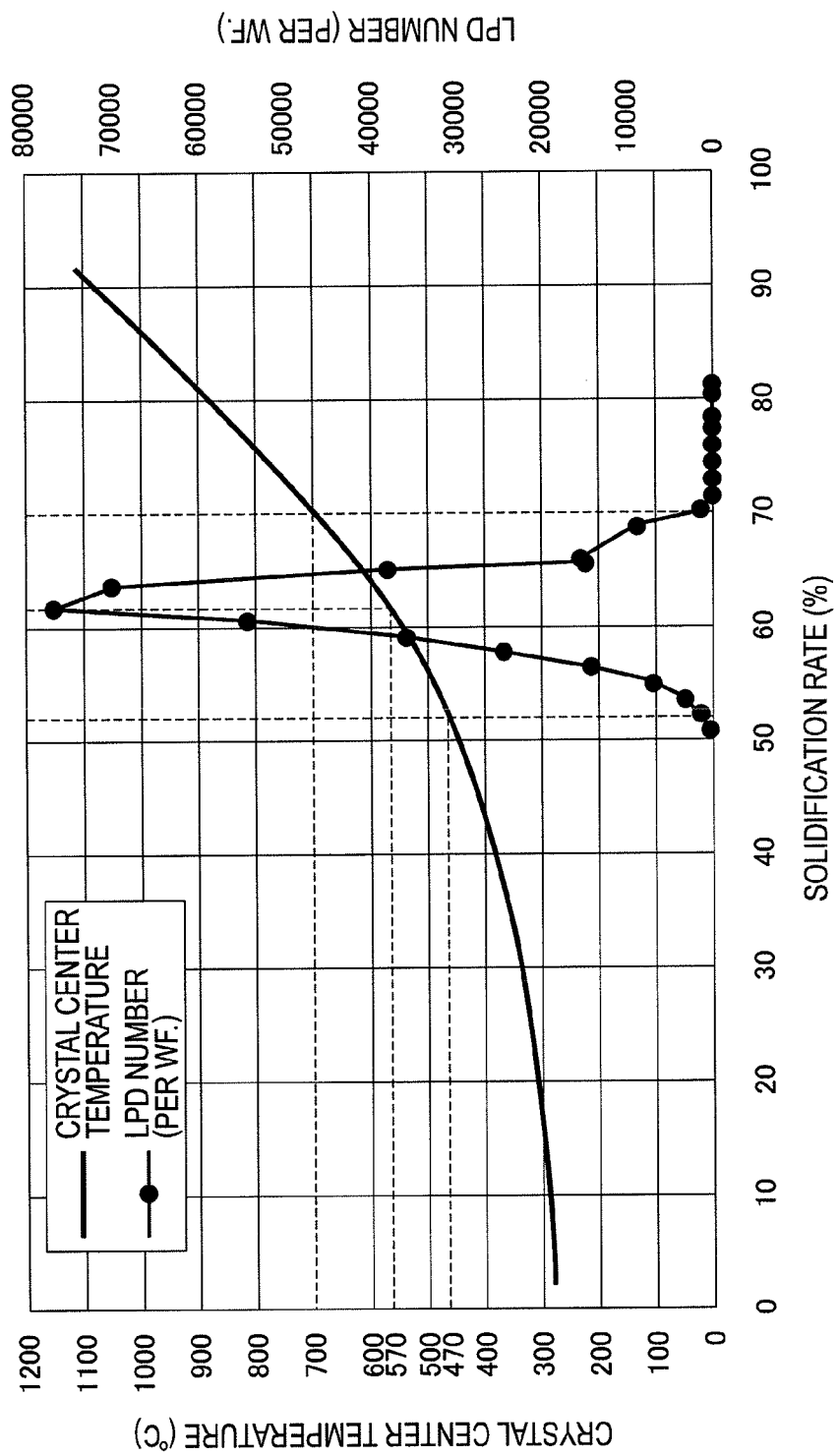
FIG. 13 is a graph showing the results of Experiment 7, which shows a relationship between the solidification rate, a center temperature of the crystal, and the LPD number in the single crystal ingot.
Figure 14:
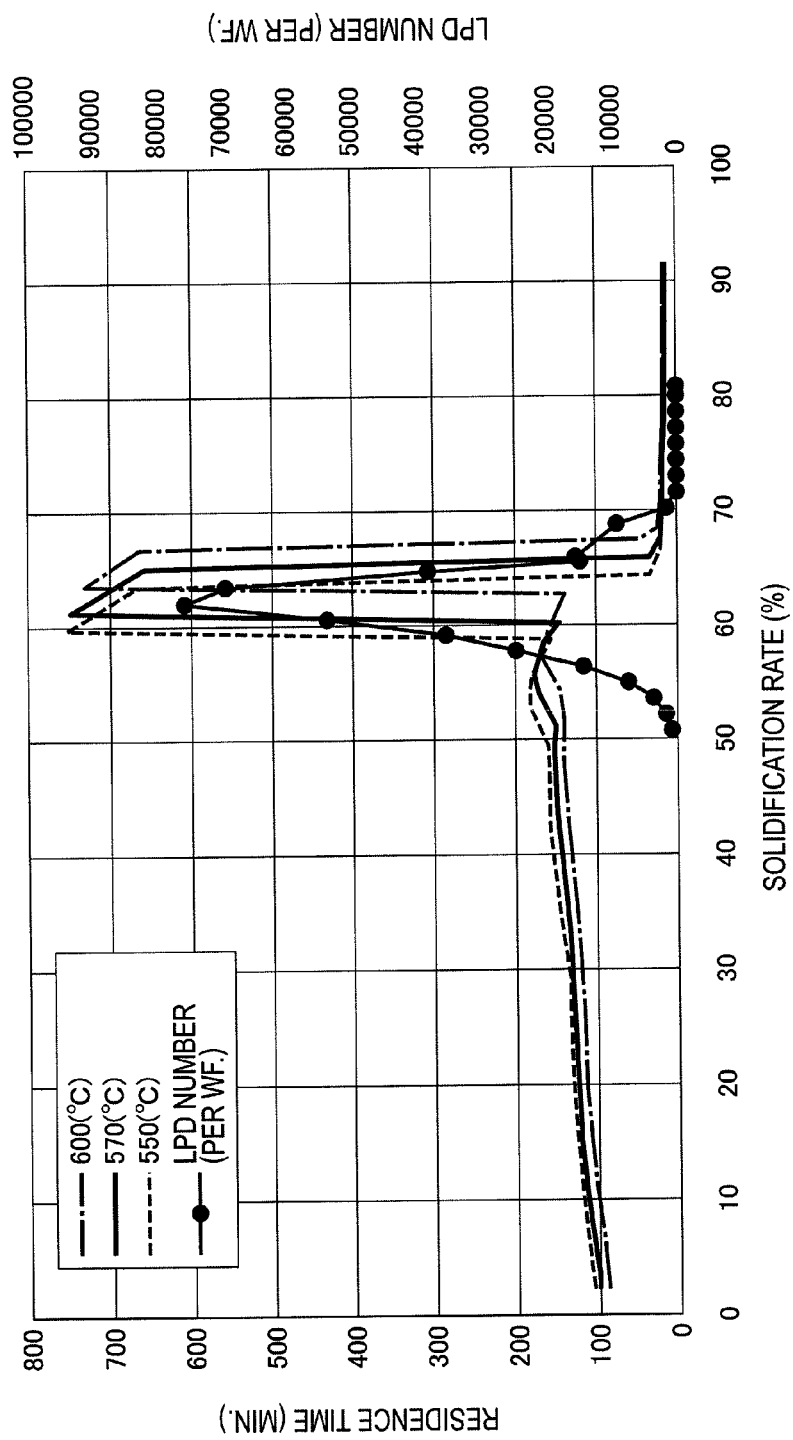
FIG. 14 is a graph showing results of Experiment 7, which shows a relationship between the solidification rate, a residence time at each of temperatures, and the LPD number when a temperature width is ±30 degrees C.
Figure 15:
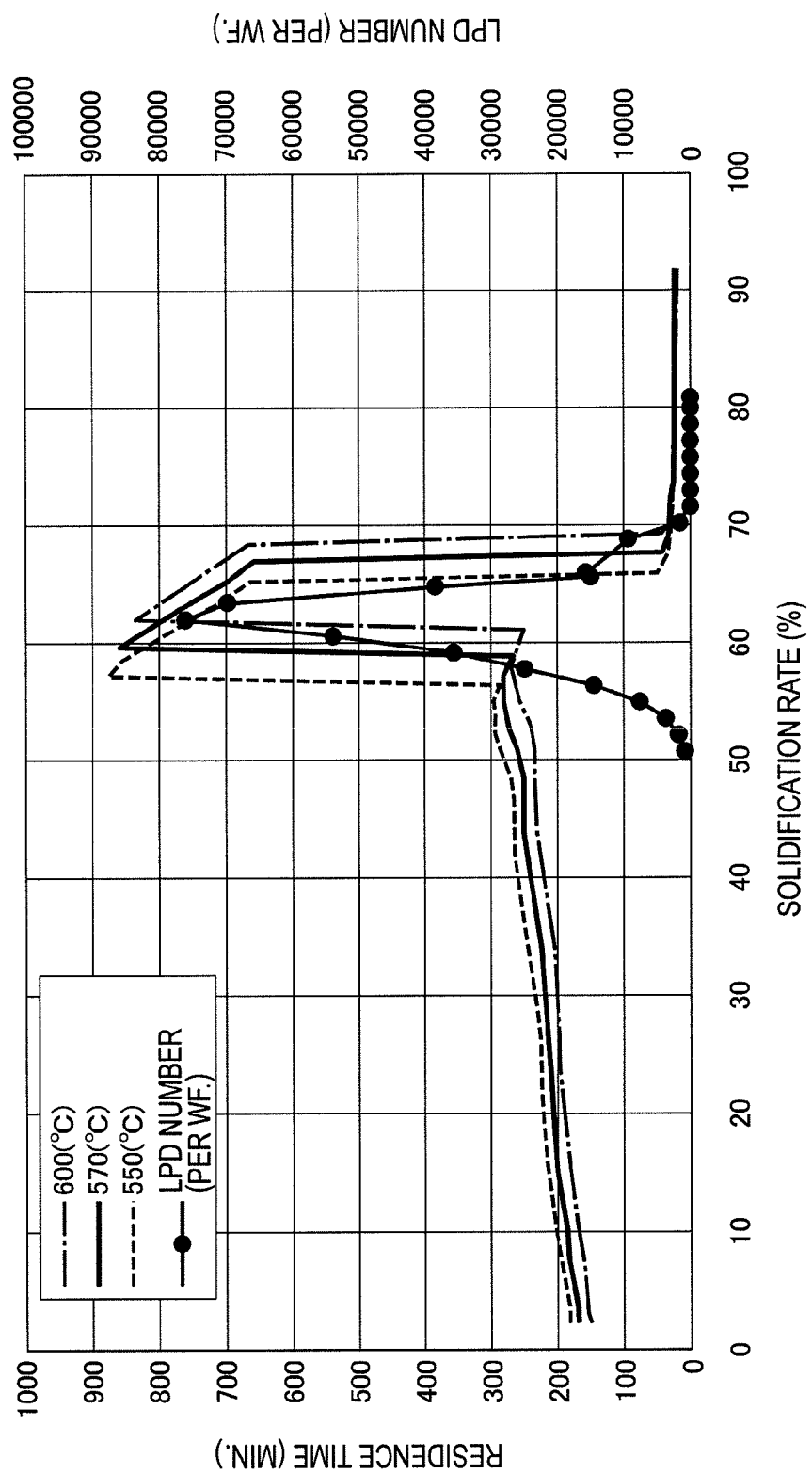
FIG. 15 is another graph showing the results of Experiment 7, which shows a relationship between the solidification rate, a residence time at each of temperatures, and the LPD number when the temperature width is ±50 degrees C.
Figure 16:
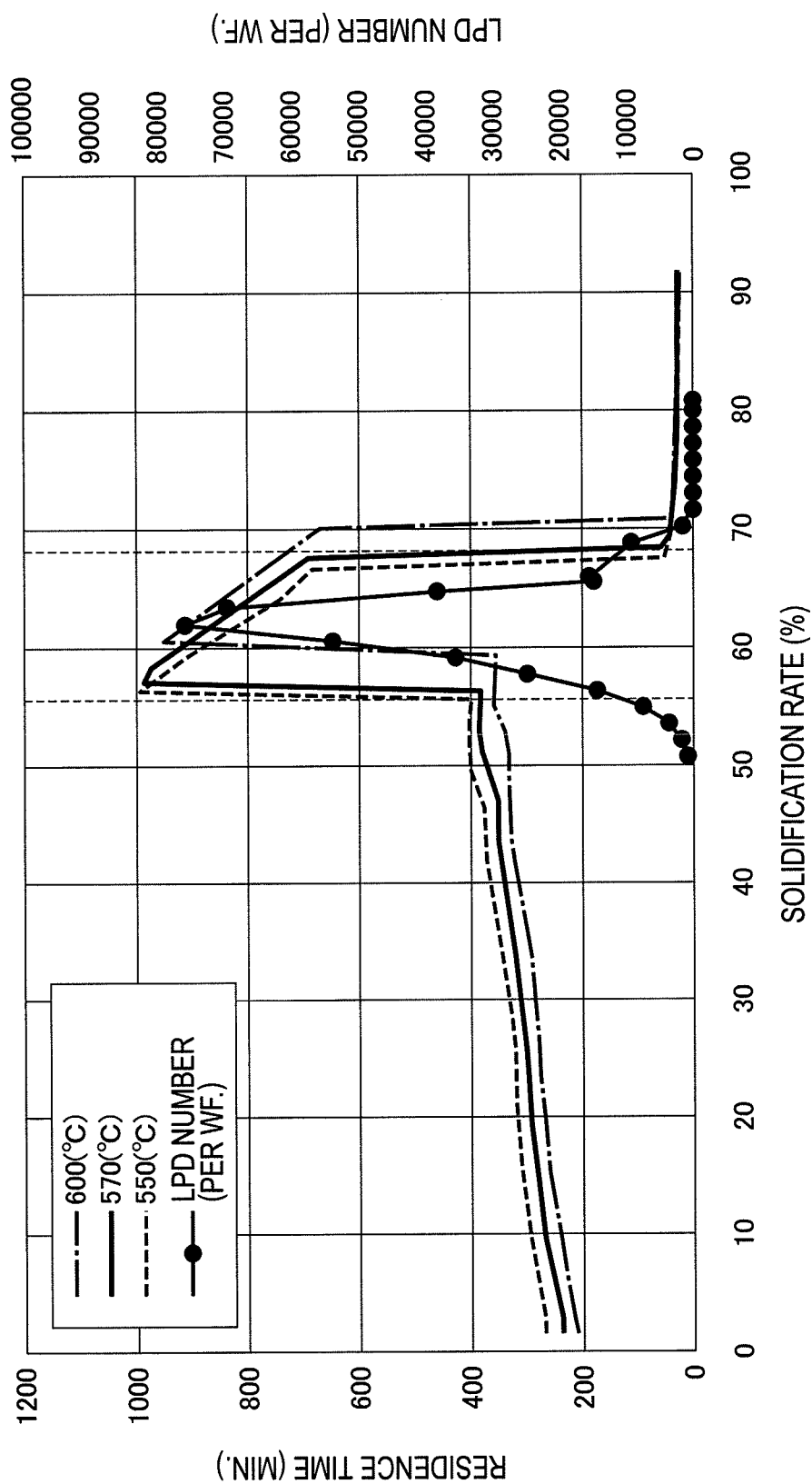
FIG. 16 is still another graph showing the results of Experiment 7, which shows a relationship between the solidification rate and a residence time in each of temperatures, and the LPD number when a temperature width is ±70 degrees C.
Figure 17:
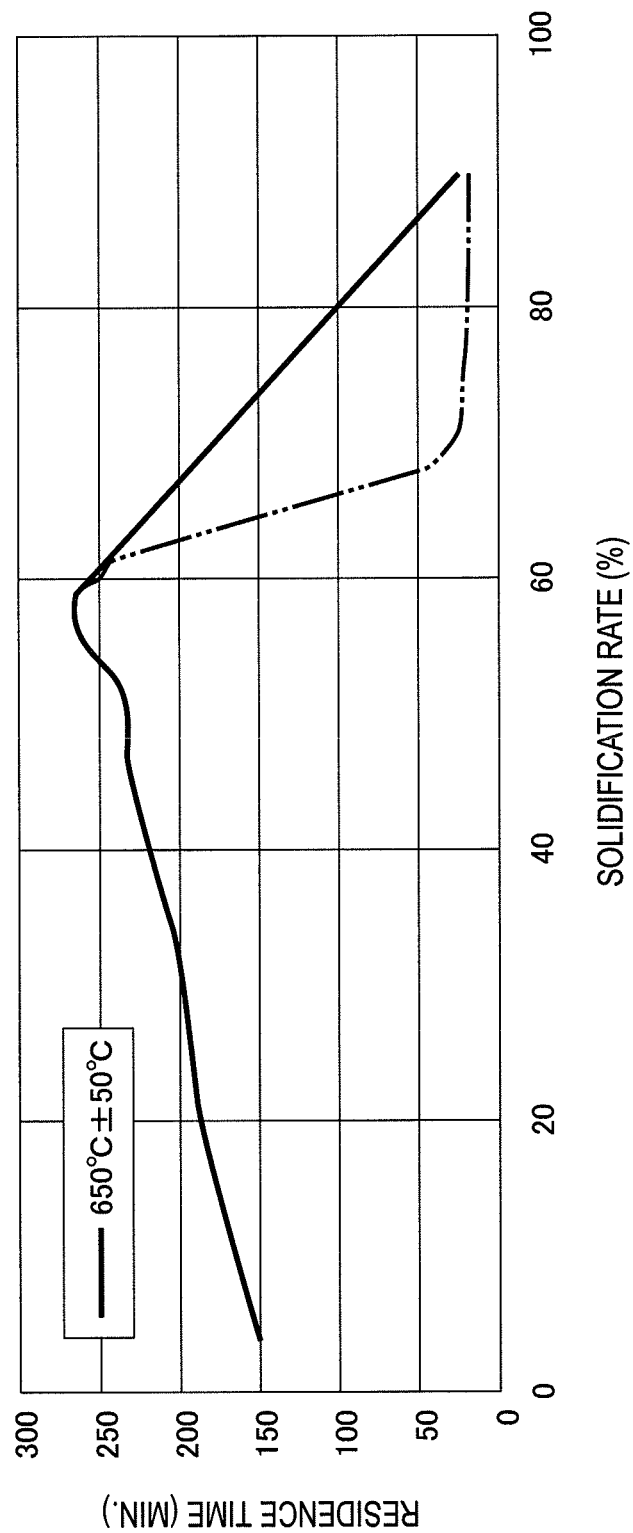
FIG. 17 is a further graph showing the results of Experiment 7, which shows a relationship between the solidification rate and the residence time of the single crystal ingot.
Figure 18:
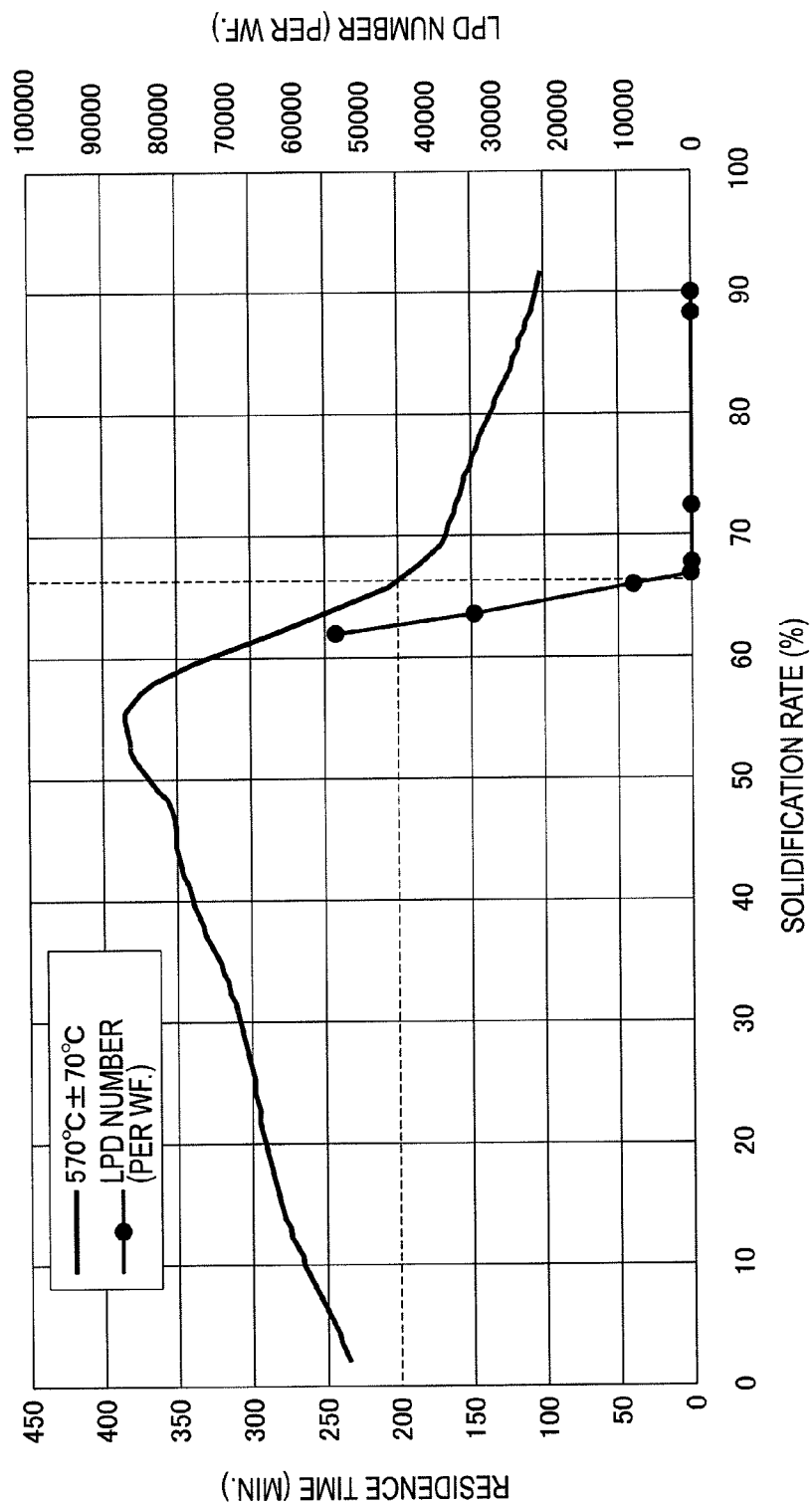
FIG. 18 is a still further graph showing results of Experiment 7, which shows a relationship between the solidification rate, the residence time at each of the temperatures, and the LPD number.
Figure 19:
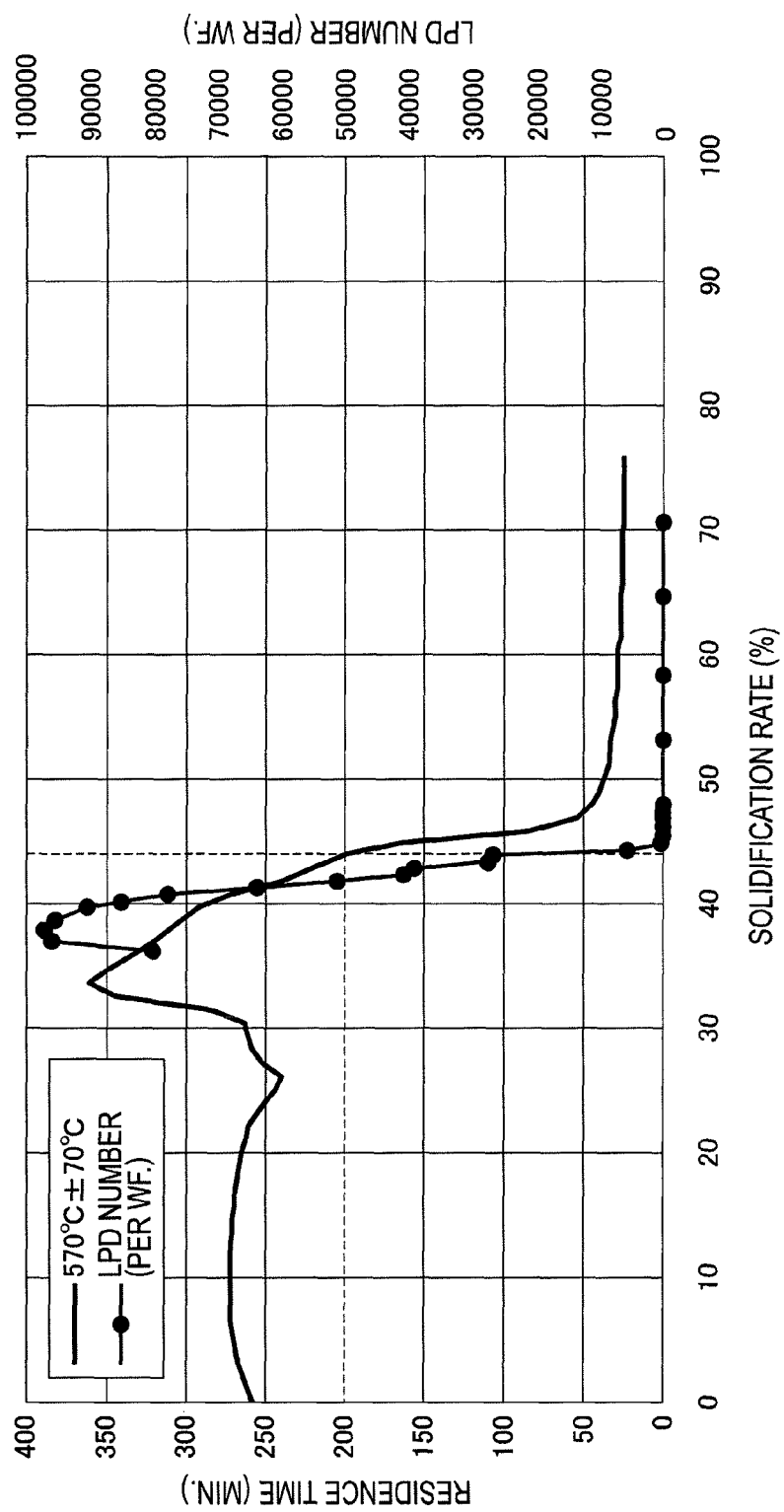
FIG. 19 is a graph showing results of an experiment performed for verifying the results of Experiment 7, which shows a relationship between the solidification rate and the residence time at each of the temperatures, and the LPD number.
Figure 20:
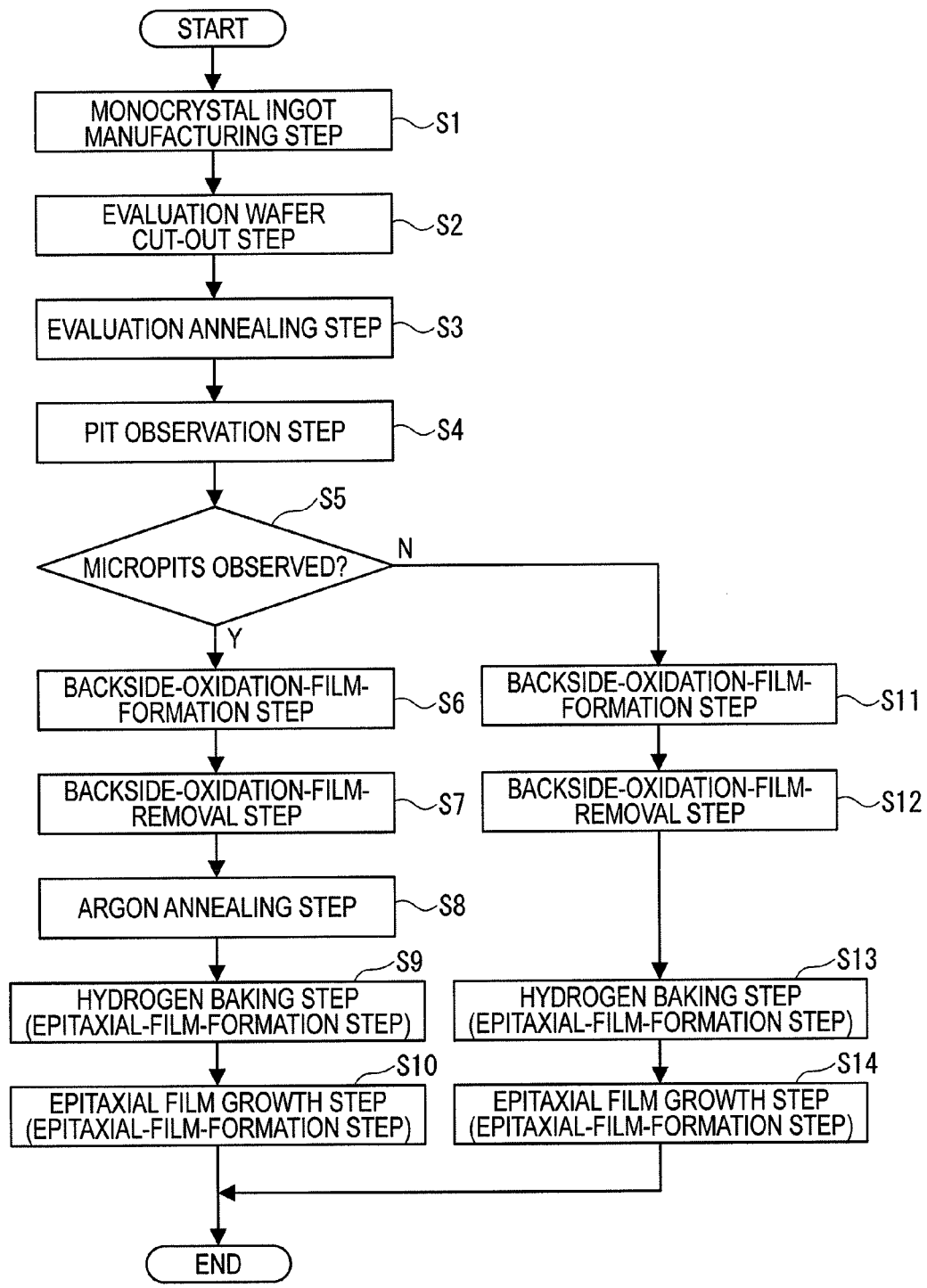
FIG. 20 is a flowchart showing a manufacturing method of an epitaxial silicon wafer according to an exemplary embodiment of the invention.

As shown in FIG. 20, a single crystal ingot manufacturing step (step S1) is conducted in the manufacturing method of an epitaxial silicon wafer.

Figure 21A:
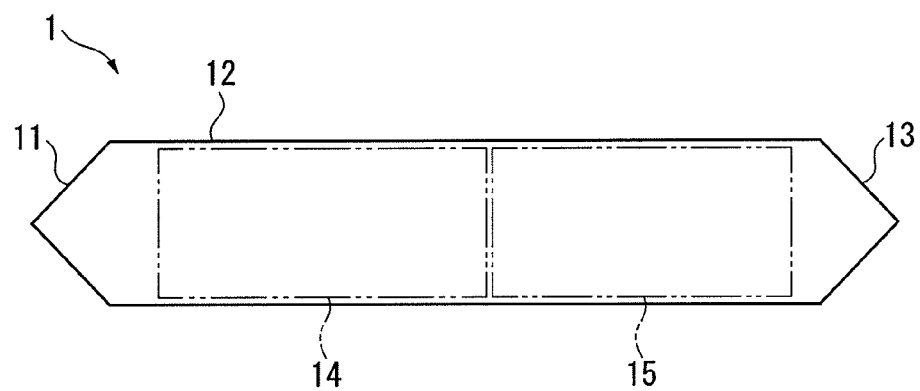
FIG. 21A is an illustration schematically showing a manufacturing process of the epitaxial silicon wafer according to the exemplary embodiment.

In the single crystal ingot manufacturing step, a single crystal ingot 1 as shown in FIG. 21A is manufactured from a silicon melt added with red phosphorus (n-type dopant) according to CZ method (Czochralski process) using a pull-up device (not shown). A diameter of the single crystal ingot 1 is 200 mm. The single crystal ingot 1 includes a shoulder 11, a straight body 12 and a tail 13.

In this exemplary embodiment, the single crystal ingot 1 is manufactured according to the following conditions so that the resistivity of silicon wafers cut out from the single crystal ingot 1 falls in a range from 0.6 mΩ·cm to 0.9 mΩ·cm.

Red phosphorus concentration: $8.29 \times 10^{19}$ atoms/cm$^3$ or more and $1.32 \times 10^{20}$ atoms/cm$^3$ or less Oxygen concentration: $7 \times 10^{17}$ atoms/cm$^3$ or more and $12 \times 10^{17}$ atoms/cm$^3$ or less In order to restrain a misfit dislocation, germanium of a concentration in a range from $3.70 \times 10^{19}$ atoms/cm$^3$ to $2.93 \times 10^{20}$ atoms/cm$^3$ may be added.

Figure 21B:
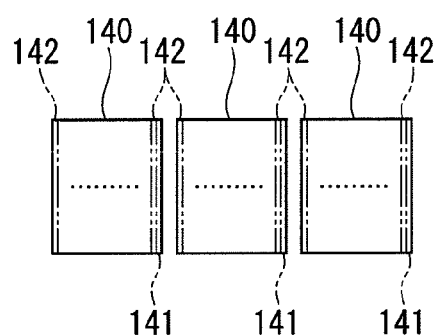
FIG. 21B is another illustration schematically showing the manufacturing process of the epitaxial silicon wafer according to the exemplary embodiment.

Subsequently, as shown in FIG. 20, an evaluation wafer cut-out step for cutting out evaluation silicon wafers 141 as shown in FIG. 21B from the single crystal ingot 1 manufactured in the step S1 is performed (step S2).

In the evaluation wafer cut-out step, a section of the straight body 12 of the single crystal ingot 1 that has been subjected to a temperature of 570±70 degrees C. for more than 200 minutes in the single crystal ingot manufacturing step is cut out in a form of a cylindrical to-be-annealed block 14 as shown in FIG. 21A. Since the to-be-annealed block 14 has experienced the above-described temperature conditions, it is highly likely that clusters are generated in the to-be-annealed block 14.

Then, the to-be-annealed block 14 is divided into three cylindrical small blocks 140. Subsequently, the evaluation silicon wafers 141 are cut out from an end of each of the small blocks 140 near the tail 13.

It should be noted that the evaluation silicon wafers 141 may be cut out from both ends of each of the small blocks 140 or from an end of each of the small blocks 140 near the shoulder 11.

Subsequently, as shown in FIG. 20, an evaluation annealing step is performed on the evaluation silicon wafers 141 cut out in the step S2 (step S3).

In the evaluation annealing step, a pit-evaluation heat treatment is applied using a batch furnace that is capable of annealing at one time a plurality of evaluation silicon wafers 141. In the batch furnace, the evaluation silicon wafers 141 are subjected to a heat treatment at 1200 degrees C. for 30 seconds in a hydrogen gas atmosphere.

Subsequently, a pit-observation step is performed on the silicon wafers 141 that has been subjected to the evaluation annealing step in the step S3 (step S4). In the pit-observation step, micropits are observed using a surface inspection system (Magics manufactured by Lasertec Corporation).

Next, whether the micropits are observed or not in step S4 is judged (step S5).

Figure 21C:
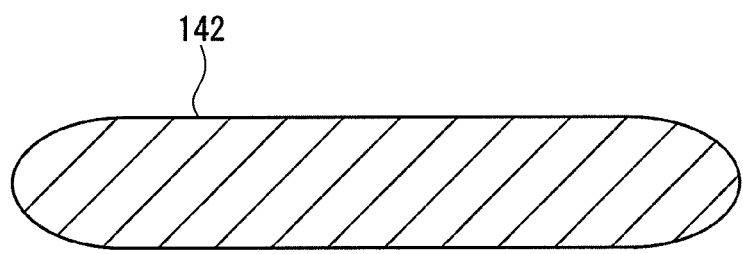
FIG. 21C is still another illustration schematically showing the manufacturing process of the epitaxial silicon wafer according to the exemplary embodiment.

In the step S5, when it is judged that the micropits are observed (i.e. when there is one or more micropits of which diameter is 500 nm or more per one square centimeter (314 or more per one silicon wafer of 200 mm diameter)), product silicon wafers 142 are cut out as shown in FIGS. 21B and 21C from the small block(s) 140 from which the evaluation silicon wafer 141 has been cut out. Then, as shown in FIG. 20, the product silicon wafers 142 are subjected to the steps of a backside-oxidation-film-formation step (step S6), a backside-oxidation-film-removal step (step S7), an argon annealing step (step S8), a hydrogen baking step ((epitaxial-film-formation step) step S9), and an epitaxial film growth step ((epitaxial-film-formation step) step S10).

In other words, since it is highly likely that the clusters are generated in the product silicon wafers 142, the silicon wafers 142 are subjected to all of the steps including the argon annealing step.

Figure 21D:
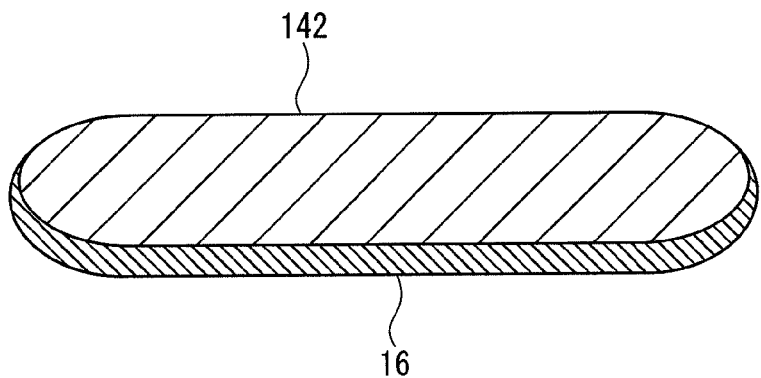
FIG. 21D is a further illustration schematically showing the manufacturing process of the epitaxial silicon wafer according to the exemplary embodiment.

Specifically, in the backside-oxidation-film-formation step of the step S6, a backside of each of the product silicon wafers 142 is subjected to a treatment according to the following conditions with a continuous normal-pressure CVD apparatus (AMAX1200 manufactured by Amaya Co., Ltd.) to form an oxidation film 16 (referred to as a backside oxidation film 16 hereinafter) on the backside of the product silicon wafer 142 as shown in FIG. 21D.

Material gas: mixture gas of silane ($SiH_4$) and oxygen ($O_2$)

Thickness of the backside proxidation film: 550 nm (in a range from 100 nm to 1500 nm)

Film-formation temperature: 430 degrees C. (in a range from 400 to 450 degrees C.)

The formation of the backside oxidation film 16 restrains the auto-doping.

Figure 21E:
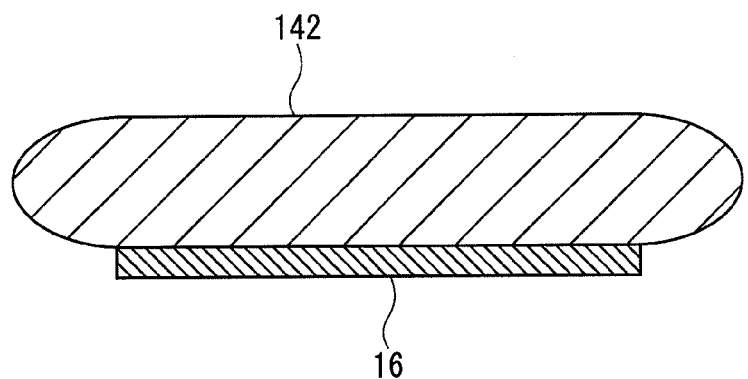
FIG. 21E is a still further illustration schematically showing the manufacturing process of the epitaxial silicon wafer according to the exemplary embodiment.

In the backside-oxidation-film-removal step (step S7), the oxidation film 16 present on the outer periphery of the backside of each of the product silicon wafers 142 is removed as shown in FIG. 21E with the use of various methods including polishing and etching (see, for instance, JP-A-2003-273063 and JP-A-2011-114210). The oxidation film 16 is preferably removed at an area less than 5 mm from an outer edge of each of the product silicon wafers 142.

The removal of the backside oxidation film 16 at the outer periphery of the silicon wafer 142 restrains the generation of so-called nodules.

In the argon annealing step (step S8), the batch furnace capable of annealing a plurality of product silicon wafers 142 at a single time is used to apply a heat treatment according to the following conditions.

Atmosphere: argon gas

Heat treatment temperature: from 1200 to 1220 degrees C.

Heat treatment time: from 60 to 120 minutes

The argon annealing step applies the solution treatment to the clusters to eliminate or reduce the clusters generated in the product silicon wafers 142.

Incidentally, red phosphorus out-diffuses in the argon annealing step to form an out-diffusion layer of a thickness in a range from 0.65 μM to 0.91 μm is formed on the surface of the product silicon wafers 142, thereby increasing a transition region width. However, since the red phosphorus moves from a high-concentration area to a low-concentration area due to a heat treatment(s) in the subsequent device production process, little problem occurs.

In the hydrogen baking step (step S9), a heat treatment is applied on each of the product silicon wafers 142 in an epitaxial apparatus according to the following conditions.

Atmosphere: hydrogen gas

Heat treatment temperature: 1200 degrees C. (in a range from 1050 to 1200 degrees C.)

Heat treatment time: 30 seconds (in a range from 30 to 300 seconds)

In other words, the heat treatment is applied under substantially the same conditions as the pit-evaluation heat treatment in the evaluation annealing step.

The hydrogen baking step removes a natural oxidation film or particles adhered on the surface of the product silicon wafers 142, thereby cleaning the product silicon wafers 142.

In the epitaxial film growth step (step S10), an epitaxial film is grown according to the following conditions on the product silicon wafers 142 after being subjected to the hydrogen baking step.

Dopant gas: phosphine ($PH_3$) gas

Material source gas: trichlorosilane ($SiHCl_3$) gas

Carrier gas: hydrogen gas

Growth temperature: 1080 degrees C. (in a range from 1000 to 1150 degrees C.)

Thickness of the epitaxial film: 5 μm (in a range from 1 μm to 10 μm)

Resistivity (epitaxial film resistivity): 1 Ω·cm (in a range from 0.01 to 10 Ω·cm) (Red phosphorus concentration: $4.86 \times 10^{15}$ atoms/cm$^3$ (in a range from $4.44 \times 10^{14}$ atoms/cm$^3$ to $4.53 \times 10^{18}$ atoms/cm$^3$))

Figure 21F:
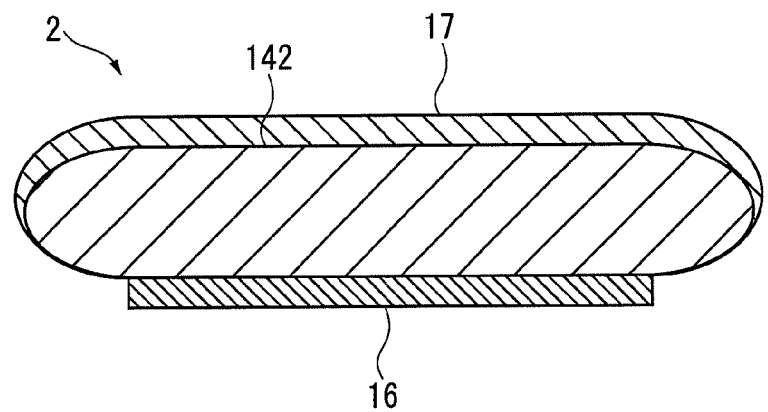
FIG. 21F is a still further illustration schematically showing the manufacturing process of the epitaxial silicon wafer according to the exemplary embodiment.

With the epitaxial film growth step being performed, an epitaxial silicon wafer 2 provided by forming an epitaxial film 17 on the surface of each of the product silicon wafers 142 as shown in FIG. 21F can be manufactured.

Even when the clusters are generated in the product silicon wafers 142 before the backside-oxidation-film-formation step, the argon annealing step eliminates or reduces the clusters, so that the number of SF generated on the epitaxial silicon wafer 2 falls at or below one per square centimeter. Further, the number of LPD generated on a single epitaxial silicon wafer 2 falls at or below 314. Thus, a high-quality epitaxial silicon wafer 2 can be manufactured.

In addition, since the argon annealing step is performed after performing the backside-oxidation-film-removal step, the out-diffusion of red phosphorus from the outer periphery uncovered by the backside oxidation film 16 can be promoted, thereby restraining the occurrence of auto-doping. Thus, the resistivity on the surface of the epitaxial film 17 can be equalized.

On the other hand, when it is judged that the micropits are not observed in the step S5 as shown in FIG. 20, in other words, that one or more per square centimeter (314 or more per a single 200-mm-diameter silicon wafer) of the micropit of which diameter is 500 nm or more is not observed, the backside-oxidation-film-formation step (step S11), the backside-oxidation-film-removal step (step S12), the hydrogen baking step ((epitaxial-film-formation step) step S13) and epitaxial film growth step ((epitaxial-film-formation step) step S14) under the same conditions as the steps S6, S7, S9 and S10 are performed on the product silicon wafers 142 cut out from the small block 140 including the evaluation silicon wafer 141.

In other words, since it is unlikely that the clusters are generated in the product silicon wafers 142, it is not necessary for the silicon wafers 142 to be subjected to the argon annealing step for solution treatment on the clusters. For the above reasons, all of the steps except for the argon annealing step are performed.

With the above steps S11 to S14 being performed, a high-quality epitaxial silicon wafers 2 with one or less per square centimeter of SF (i.e. 314 or less of LPD per a single epitaxial silicon wafer 2) can be manufactured.

Additionally, as shown in FIG. 21A, the section(s) that has experienced the temperature of 570±70 degrees C. for 200 minutes or less (the section(s) near the tail 13 of the to-be-annealed block 14) in the single crystal ingot manufacturing step is cut out in a form of a cylindrical unnecessary-to-be-annealed block 15. Since the unnecessary-to-be-annealed block 15 is manufactured under the above-mentioned temperature conditions, it is extremely unlikely that the clusters are generated.

The product silicon wafers are cut out from the unnecessary-to-be-annealed block 15 and are subjected only to the process of steps S11 to S14 without applying the above-described steps S2 to S10, whereby the above-described high-quality epitaxial silicon wafer 2 can be manufactured.

Modifications

It should be understood that the scope of the invention is not limited to the above-described exemplary embodiment(s) but various improvements and design alterations are possible as long as such improvements and alterations are compatible with the invention.

For instance, without applying the processes according to the steps S2 to S5 and S11 to S14, the processes according to the steps S6 to S10 may be applied on all of the product silicon wafers 142 cut out from the straight body 12.

Further, the unnecessary-to-be-annealed block 15 in the above exemplary embodiment may be cut out as the to-be-annealed block 14 and the processes according to the steps S2 to S14 may be applied on the to-be-annealed block 14. In other words, irrespective of whether or not being subjected to the temperature of 570±70 degrees C. for 200 minutes or less in the single crystal ingot manufacturing step, the processes according to the steps S2 to S14 may be performed.

What is claimed is:

1. A manufacturing method of an epitaxial silicon wafer provided by forming an epitaxial film on a surface of a silicon wafer added with phosphorus so that resistivity of the silicon wafer falls at or below 0.9 mΩ·cm, the method comprising:
    forming an oxidation film on a backside of a silicon wafer cut out from a single crystal ingot prepared by a Czochralski process;
    removing the oxidation film present at an outer periphery of the silicon wafer;
    argon annealing in which a heat treatment is applied on the silicon wafer after removing the oxidation film in a gas atmosphere consisting of argon at a temperature in a range from 1200 to 1220 degrees C.;
    applying a heat treatment under a hydrogen gas atmosphere on the silicon wafer after being subjected to the argon annealing; and
    growing the epitaxial film on the surface of the silicon wafer after applying the heat treatment under the hydrogen gas atmosphere.

2. The manufacturing method of an epitaxial silicon wafer according to claim 1, further comprising:
    performing a pit-evaluation heat treatment on an evaluation silicon wafer cut out from the single crystal ingot, all of steps from the forming of the oxidation film on the backside to the growing of the epitaxial film being performed on the silicon wafer cut out from a section including a cut point of the evaluation silicon wafer when pits are observed on a surface of the evaluation silicon wafer.

3. The manufacturing method of an epitaxial silicon wafer according to claim 1, wherein the silicon wafer cut out from the single crystal ingot is cut out from a section of the single crystal ingot that has been heated in a temperature range from 570±70 degrees C. for more than 200 minutes during a manufacturing process of the single crystal ingot.

4. The manufacturing method of an epitaxial silicon wafer according to claim 1, wherein a resistivity of the silicon wafer is less than 0.8 mΩ·cm.

5. The manufacturing method of an epitaxial silicon wafer according to claim 4, wherein the resistivity of the silicon wafer is 0.6 mΩ·cm or more.

6. The manufacturing method of an epitaxial silicon wafer according to claim 1, further comprising:
    manufacturing the single crystal ingot by the Czochralski process with an addition of germanium so that a concentration of the germanium in the silicon wafer falls within a range from $3.70 \times 10^{19}$ atoms/cm$^3$ to $2.93 \times 10^{20}$ atoms/cm$^3$.

7. The manufacturing method of an epitaxial silicon wafer according to claim 1, wherein in the argon annealing, heat is applied so that clusters formed by bonded oxygen and phosphorus in the silicon wafer are subjected to a solution treatment and phosphorus on the surface of the silicon wafer is out-diffused.

8. The manufacturing method of an epitaxial silicon wafer according to claim 7, wherein a heat treatment time of the argon annealing is in a range from 30 minutes to 120 minutes.

9. The manufacturing method of an epitaxial silicon wafer according to claim 8, wherein a heat treatment time of the argon annealing is in a range from 60 minutes to 120 minutes.

* * * * *